United States Patent
Ranjan et al.

(10) Patent No.: US 8,508,984 B2
(45) Date of Patent: *Aug. 13, 2013

(54) LOW RESISTANCE HIGH-TMR MAGNETIC TUNNEL JUNCTION AND PROCESS FOR FABRICATION THEREOF

(75) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

(*) Notice: Subject to any disclaimer, the term of this patent is extended or adjusted under 35 U.S.C. 154(b) by 1367 days.

This patent is subject to a terminal disclaimer.

(21) Appl. No.: 12/040,801

(22) Filed: Feb. 29, 2008

(65) Prior Publication Data

US 2008/0164548 A1  Jul. 10, 2008

Related U.S. Application Data

(63) Continuation-in-part of application No. 11/674,124, filed on Feb. 12, 2007, now Pat. No. 8,084,835, which is a continuation-in-part of application No. 11/678,515, filed on Feb. 23, 2007, now Pat. No. 8,058,696, said application No. 12/040,801 is a continuation-in-part of application No. 11/739,648, filed on Apr. 24, 2007, now Pat. No. 8,183,652, and a continuation-in-part of application No. 11/740,861, filed on Apr. 26, 2007, and a continuation-in-part of application No. 11/776,692, filed on Jul. 12, 2007, now Pat. No. 8,063,459, and a continuation-in-part of application No. 11/860,467, filed on Sep. 24, 2007, now Pat. No. 8,018,011, and a continuation-in-part of application No. 11/866,830, filed on Oct. 3, 2007, and a continuation-in-part of application No. 11/932,940, filed on Oct. 31, 2007, now Pat. No. 7,732,881.

(60) Provisional application No. 60/853,115, filed on Oct. 20, 2006, provisional application No. 60/777,012, filed on Feb. 25, 2006, provisional application No. 60/863,812, filed on Nov. 1, 2006.

(51) Int. Cl.
*G11C 11/00* (2006.01)

(52) U.S. Cl.
USPC ......................................... 365/158; 365/171

(58) Field of Classification Search
USPC ................................................ 365/158, 171
See application file for complete search history.

(56) References Cited

U.S. PATENT DOCUMENTS

| | | | |
|---|---|---|---|
| 3,665,264 | A | 5/1972 | Yukami et al. |
| 5,060,098 | A | 10/1991 | Gotoh et al. |

(Continued)

FOREIGN PATENT DOCUMENTS

| | | |
|---|---|---|
| JP | 2002197851 A | 7/2002 |
| JP | 2004006774 A | 1/2004 |

(Continued)

OTHER PUBLICATIONS

L.Berger, Emission of spin waves by a magnetic nulitlayer traversed by a current, article, Oct. 1, 1996, 6 pages, vol. 54, No. 13, The American Physical Society.

(Continued)

*Primary Examiner* — Pho M Luu

(74) *Attorney, Agent, or Firm* — Maryam Imam; IPxLAW Group LLP

(57) ABSTRACT

A non-volatile magnetic memory element includes a fixed layer, a barrier layer formed on top of the fixed layer, and a free layer formed on top of the barrier layer, wherein the electrical resistivity of the barrier layer is reduced by placing said barrier layer under compressive stress. Compressive stress is induced by either using a compressive stress inducing layer, or by using inert gases at low pressure during the sputtering process as the barrier layer is deposited, or by introducing compressive stress inducing molecules into the molecular lattice of the barrier layer.

25 Claims, 8 Drawing Sheets

(56) References Cited

U.S. PATENT DOCUMENTS

| | | | |
|---|---|---|---|
| 5,695,864 | A | 12/1997 | Slonczewski |
| 6,072,718 | A | 6/2000 | Abraham et al. |
| 6,169,689 | B1 | 1/2001 | Naji |
| 6,180,444 | B1* | 1/2001 | Gates et al. ............ 438/237 |
| 6,285,581 | B1 | 9/2001 | Tehrani et al. |
| 6,365,419 | B1 | 4/2002 | Durlam et al. |
| 6,421,270 | B1 | 7/2002 | Tai |
| 6,469,926 | B1 | 10/2002 | Chen |
| 6,501,139 | B1 | 12/2002 | Petti |
| 6,590,806 | B1 | 7/2003 | Bhattacharyya |
| 6,603,677 | B2 | 8/2003 | Redon et al. |
| 6,639,312 | B2 | 10/2003 | Herner et al. |
| 6,642,595 | B1 | 11/2003 | Hung et al. |
| 6,649,451 | B1 | 11/2003 | Vyvoda et al. |
| 6,670,660 | B2 | 12/2003 | Hosotani |
| 6,697,294 | B1 | 2/2004 | Qi et al. |
| 6,714,444 | B2 | 3/2004 | Huai et al. |
| 6,724,585 | B2 | 4/2004 | Hayashi |
| 6,743,642 | B2 | 6/2004 | Costrini et al. |
| 6,744,086 | B2 | 6/2004 | Daughton et al. |
| 6,759,263 | B2 | 7/2004 | Ying et al. |
| 6,765,819 | B1* | 7/2004 | Bhattacharyya et al. ...... 365/158 |
| 6,783,999 | B1 | 8/2004 | Lee |
| 6,821,907 | B2 | 11/2004 | Hwang et al. |
| 6,893,893 | B2 | 5/2005 | Nallan et al. |
| 6,905,578 | B1 | 6/2005 | Moslehi et al. |
| 6,920,063 | B2 | 7/2005 | Huai et al. |
| 6,933,155 | B2 | 8/2005 | Albert et al. |
| 6,937,497 | B1* | 8/2005 | Ju et al. ............ 365/130 |
| 6,964,928 | B2 | 11/2005 | Ying et al. |
| 6,984,561 | B2 | 1/2006 | Herner et al. |
| 6,984,585 | B2 | 1/2006 | Ying et al. |
| 6,985,385 | B2 | 1/2006 | Nguyen et al. |
| 6,992,359 | B2 | 1/2006 | Nguyen et al. |
| 6,995,422 | B2 | 2/2006 | Herner et al. |
| 7,002,781 | B2 | 2/2006 | Sugawara |
| 7,005,730 | B2 | 2/2006 | Verma et al. |
| 7,009,877 | B1 | 3/2006 | Huai et al. |
| 7,018,878 | B2 | 3/2006 | Vyvoda et al. |
| 7,023,725 | B2 | 4/2006 | Saito et al. |
| 7,023,739 | B2 | 4/2006 | Chen et al. |
| 7,026,673 | B2 | 4/2006 | Abraham |
| 7,057,921 | B2 | 6/2006 | Valet |
| 7,088,609 | B2 | 8/2006 | Valet |
| 7,106,624 | B2 | 9/2006 | Huai et al. |
| 7,109,539 | B2 | 9/2006 | Lu |
| 7,120,049 | B2 | 10/2006 | Nakamura et al. |
| 7,123,498 | B2 | 10/2006 | Miyatake et al. |
| 7,126,201 | B2 | 10/2006 | Matsutera et al. |
| 7,148,531 | B2 | 12/2006 | Daughton et al. |
| 7,170,775 | B2 | 1/2007 | Lin et al. |
| 7,183,130 | B2 | 2/2007 | Neutzel et al. |
| 7,732,881 | B2* | 6/2010 | Wang ............ 257/421 |
| 8,018,011 | B2* | 9/2011 | Ranjan et al. ............ 257/421 |
| 8,058,696 | B2* | 11/2011 | Ranjan et al. ............ 257/421 |
| 8,063,459 | B2* | 11/2011 | Ranjan et al. ............ 257/421 |
| 8,084,835 | B2* | 12/2011 | Ranjan et al. ............ 257/421 |
| 8,183,652 | B2* | 5/2012 | Ranjan et al. ............ 257/421 |
| 2002/0048128 | A1 | 4/2002 | Kamiguchi et al. |
| 2003/0108776 | A1 | 6/2003 | Chang et al. |
| 2003/0123200 | A1 | 7/2003 | Nagasaka et al. |
| 2003/0128483 | A1 | 7/2003 | Kamijo |
| 2003/0232223 | A1 | 12/2003 | Leddy et al. |
| 2004/0042128 | A1 | 3/2004 | Slaughter et al. |
| 2004/0130936 | A1 | 7/2004 | Nguyen et al. |
| 2004/0159832 | A1 | 8/2004 | Hack |
| 2004/0170055 | A1 | 9/2004 | Albert et al. |
| 2004/0188732 | A1* | 9/2004 | Fukuzumi ............ 257/295 |
| 2004/0201070 | A1 | 10/2004 | Deak |
| 2005/0045913 | A1 | 3/2005 | Nguyen et al. |
| 2005/0063222 | A1 | 3/2005 | Huai et al. |
| 2005/0105325 | A1 | 5/2005 | Haneda et al. |
| 2005/0167657 | A1 | 8/2005 | Nickel et al. |
| 2005/0195532 | A1 | 9/2005 | Sugiyama et al. |
| 2005/0201020 | A1 | 9/2005 | Fuke et al. |
| 2005/0201022 | A1* | 9/2005 | Horng et al. ............ 360/324.11 |
| 2005/0207219 | A1 | 9/2005 | Lee et al. |
| 2005/0254287 | A1 | 11/2005 | Valet et al. |
| 2006/0017081 | A1 | 1/2006 | Sun et al. |
| 2006/0081953 | A1 | 4/2006 | Nguyen et al. |
| 2006/0083056 | A1 | 4/2006 | Daughton et al. |
| 2006/0104110 | A1 | 5/2006 | Sun et al. |
| 2006/0109591 | A1 | 5/2006 | Ranjan et al. |
| 2006/0114620 | A1 | 6/2006 | Sbiaa et al. |
| 2006/0141640 | A1 | 6/2006 | Huai et al. |
| 2006/0171198 | A1 | 8/2006 | Saito et al. |
| 2006/0187703 | A1 | 8/2006 | Mizuguchi et al. |
| 2006/0192237 | A1 | 8/2006 | Huai |
| 2006/0227465 | A1 | 10/2006 | Inokuchi et al. |
| 2006/0239066 | A1 | 10/2006 | Liaw |
| 2006/0268604 | A1 | 11/2006 | Onogi et al. |
| 2007/0007609 | A1 | 1/2007 | Saito et al. |
| 2007/0085068 | A1 | 4/2007 | Apalkov et al. |
| 2007/0164336 | A1 | 7/2007 | Saito et al. |
| 2008/0043519 | A1 | 2/2008 | Kitagawa et al. |

FOREIGN PATENT DOCUMENTS

| | | |
|---|---|---|
| JP | 2006157027 A | 6/2006 |
| JP | 2006269530 A | 10/2006 |
| JP | 2006277864 A | 10/2006 |
| JP | 2006295198 | 10/2006 |
| JP | 2007073971 | 3/2007 |
| JP | 2007096105 A | 4/2007 |
| JP | 2007142364 A | 6/2007 |

OTHER PUBLICATIONS

F.J. Albert, J.A. Katine, R.A. Buhrman, and D.C. Ralph, Spin-polarized current switching of a Co thin film nanomagnet, article, Dec. 4, 2000, 3 pages, vol. 77-No. 23, American Institute of Physics.

B.N. Engel, J. Akerman, B. Butcher, R.W. Dave, M. Deherrera, M. Durlam, G. Grynkewich, J. Janesky, S.V. Pietambaram, N.D. Rizzo, J.M. Slaughter, K. Smith, J.J. Sun, and S. Tehrani, A 4-Mb Toggle MRAM Based on a Novel Bit and Switching Method, article, Jan. 2005, 5 pages, vol. 41-No. 1, IEEE Transactions on Magnetics.

J.C. Slonczewski, Letter to the Editor: Current-driven excitation of magnetic multilayers, journal, Dec. 19, 1995, 7 pages, Journal of Magnetism and Magnetic Materials 159.

Sossmeier, K.D. et al., Comparison between ac and dc current annealing in CoFeSiB glass-covered amorphouse microwires, J. Phys. D: Appl. Phys. 40 (2007) 3233-3238.

Nowosielski, R. et al., Crystallization kinetics of an amorphous Co77Si11.5B11.5 alloy, JAMME, Jul.-Aug. 2006. vol. 17, Issue 1-2, pp. 121-124.

Hiki, Y., et al., Stabilization of metallic glass by isochronal and isothermal annealing treatments, J. Phys.: Condens. Matter 19 (2007) 2005147 (7 pp).

Kubota, H., et al., Dependence of spin-transfer switching current on free layer thickness in Co-Fe-B/MgO/Co-Fe-B magnetic tunnel junctions, App. Phys. Letters 89, 032505 (2006) (3 pp.).

Tsunekawa, K., et al., Structural and Electrical Properties of (CoxFe100-x)81B19/MgO/(CoxFe100-x)81B19 Magnetic Tunnel Junctions, HA-01 Intermag, May 12, 2006, 15 pp.

Munakata, M., et al., B-Concentration Dependence on Anisotropy Field of CoFeB Thin Film for Gigahertz Frequency Use, IEEE Transactions on Magnetics, vol. 41, No. 10, Oct. 2005, pp. 3262-3264.

Park, C., et al., Annealing effects on structural and transport properties of rf-sputtered CoFeB/MgO/CoFeB magnetic tunnel junctions, J. Applied Physics 99, 08A901 (2006), pp. 2639-2641.

Burton, J.D., et al., Atomic and Electronic Structure of the CoFeB/MgO Interface from First Principles, 3 pp.

Hayakawa, J., et al., Dependence of Giant Tunnel Magnetoresistance of Sputtered CoFeB/MgO/CoFeB Magnetic Tunnel Junctions on MgO Barrier Thickness and Annealing Temperature, 17 pp.

Ikeda, S., et al., Dependence of tunnel magnetoresistance on ferromagnetic electrode materials in MgO-barrier magnetic tunnel junctions, 9 pp.

Lee, Y. M., et al., Giant tunnel magnetoresistance and high annealing stability in CoFeB/MgO/CoFeB magnetic tunnel junctions with synthetic pinned inned layer, 17 pp.

Albert, F.J., et al., Spin-polarized current switching of a Co thin film nanomagnet, Applied Physics Letters, vol. 77, No. 23, Dec. 4, 2000, pp. 3809-3811.

Emley, N.C., et al., Reduction of spin transfer by synthetic antiferromagnets, Applied Physics Letters, vol. 84, No. 21, May 24, 2004, pp. 4257-4259.

Fuchs, G.D., et al., Spin-transfer effects in nanoscale magnetic tunnel junctions, Applied Physics Letters, vol. 85, No. 7, Aug. 16, 2004, pp. 1205-1207.

Fuchs, G.D., et al., Adjustable spin torque in magnetic tunnel junctions with two fixed layers, Applied Physics Letters, 86, 152509 (2005), 3 pp.

Braganca, P.M., et al., Reducing the critical current for short-pulse spin-transfer switching of nanomagnets, Applied Physics Letters 87, 112507 (2005), 3 pp.

Ozatay, O., et al., Spin transfer by nonuniform current injection into a nanomagnet, Applied Physics Letters 88, 202502 (2006), 3 pp.

Kiselev, S., et al., Spin-Transfer-Driven Magnetic Switching and Precession, Nanomagnetics Workshop, May 14, 2004, 25 pp.

Tinkham, M., et al., Tunneling Through Metallic Quantum Dots, J. of Low Temperature Physics, vol. 118, Nos. 5/6, 2000, pp. 271-285.

Krivorotov, I.N., et al., Large-amplitude coherent spin waves exited by spin-polarized current in nanoscale spin valves, 24 pp.

Pribiag, V.S., et al., Magnetic vortex oscillator driven by dc spin-polarized current, 14 pp.

Salinas, D.G., et al., Effects of spin-orbit interactions on tunneling via discrete energy levels in metal nanoparticles, Physical Review B, vol. 60, No. 8, Aug. 15, 1999, pp. 6137-6145.

Waintal, X., et al., Role of spin-dependent interface scattering in generating current-induced torques in magnetic multilayers, Physical Review B, vol. 62, No. 18, Nov. 1, 2000, pp. 12317-12327.

Kiselev, S. I., et al., Spin-transfer excitations of permalloy nanopillars for large applied currents, Physical Review B 72, 064430 (2005), 10 pp.

Katine, J.A., et al., Current-Driven Magnetization Reversal and Spin-Wave Excitations in Co/Cu/Co Pillars, Physical Review Letters, vol. 84, No. 14, Apr. 3, 2000, pp. 3149-3152.

Myers, E.B., et al., Thermally Activated Magnetic Reversal Induced by a Spin-Polarized Current, Physical Review Letters, vol. 89, No. 19, Nov. 4, 2002, 4 pp.

Albert, F.J., et al., Quantitative Study of Magnetization Reversal by Spin-Polarized Current in Magnetic Multilayer Nanopillars, Physical Review Letters, vol. 89, No. 22, Nov. 25, 2002, 4 pp.

Kiselev, S. I., et al., Current-Induced Nanomagnetic Dynamics for Magnetic Fields Perpendicular to the Sample Plane, Physical Review Letters, vol. 93, No. 3, Jul. 16, 2004, 4 pp.

Krivorotov, I.N., Temperature Dependence of Spin-Transfer-Induced Switching of Nanomagnets, Physical Review Letters, vol. 93. No. 16, Oct. 15, 2004, 4 pp.

Fuchs, G.D., et al., Spin Torque Tunnel-Current Spin Polarization and Magnetoresistance in MgO Magnetic Tunnel Junctions, Physical Review Letters 96, 186603, May 12, 2006, 4 pp.

Myers, E.B., Current-Induced Switching of Domains in Magnetic Multilayer Devices, Science, vol. 285, Aug. 6. 1999, pp. 867-870.

Krivorotov, I.N., Time-Domain Measurements of Nanomagnet Dynamics Driven by Spin-Transfer Torques, Science, vol. 307, Jan. 14, 2005.

Myers, E.B., Currrent-Induced Switching of Domains in Magnetic Multilayer Devices, 14 pp.

Shibata, J., et al., Magnetic Vortex Dynamics Induced by Spin-Transfer Torque, 1 p.

Klaui, M., et al., Direct Observation of Domain-Wall Configurations Transformed by Spin Currents, Physical Review Letters 95, 026601 Jul. 8, 2005, 4 pp.

Thomas, L., et al., Oscillatory dependence of current-driven magnetic domain wall motion on current pulse length, Nature, vol. 443/ 14, Sep. 2006, pp. 197-200.

Saitoh, E., et al., Current-induced resonance and mass determination of a single magnetic domain wall, Nature, vol. 431, Nov. 11, 2004, pp. 203-206.

Jung, S-W, et al., Current-Induced Magnetic Domain-Wall Motion by Spin Transfer Torque: Collective Coordinate Approach with Domain-Wall Width Variation, 13 pp.

Vanhaverbeke, a., et al., Transverse domain wall propagated by spin-polarized current, IBM Research, Zurich Research Laboratory, 1 p.

Bazaliy, Y.B., et al., Nonlinear regimes of current-induced domain wall motion, 29 pp.

Waintal, X., et al., Current induced distortion of a magnetic domain wall, May 9, 2007, 5 pp.

Laufenberg, M., Dissertation, Interactions Between Current and Domain Wall Spin Structures, Jul. 26, 2006, 210 pp.

Vernier, N., et al., Domain wall propagation in magnetic nanowires by spin polarized current injection, 17 pp.

Beach, G.S.D., et al., Dynamics of field-driven domain-wall propagation in ferromagnetic nanowires, Nature Materials 4, 741-744 (2005).

Varga, E., Domain wall motion in permalloy wires, 12 pp.

Lua, S.Y.H., et al., Effect of an exchange tab on the magnetization switching process of magnetic nanowires, J. Phys. D: Appl. Phys 40 (2007) 3011-3015.

Ohno, H., et al., Electrical Manipulation of Domain Walls in Ferromagnetic Semiconductors, Croucher Advanced Study Institute— Science and Applications of Spin Electronics, The University of Hong Kong, Aug. 15-20, 2005, 23 pp.

Stiles, M.D., et al., Adiabatic Domain Wall Motion and Landau-Lifshitz Damping, May 31, 2007. 6 pp.

Jubert, P.O., Structure and current-induced motion of magnetic domain walls, 4 pp.

Berakdar, J., et al., Spin transport and spin torque in a magnetic nanowire with a non-collinear magnetic order, J. Physics: Conference Series 61 (2007) 105-109.

Huai, Y. et al., Spin transfer switching current reduction in magnetic tunnel junction based dual spin filter structures, Appl. Phys. Lett. 87, 222510 (2005), 3 pp.

Hayakawa, J. et al., Current-Driven Magnetization Switching in CoFeB/MgO/CoFeB Magnetic Tunnel Junctions, JJAP, vol. 44, No. 41, 2005, pp. L1267-L1270.

Kalitsov, A. et al., Spin-polarized current-induced torque in magnetic tunnel junctions, J. Appl. Phys. 99, 08G501 (2006), 3 pp.

Vedyayev, A. et al., Resonant spin-torque in double barrier magnetic tunnel junctions, Physics Letters A 355 (2006), pp. 243-246.

Manchon, A. Modelling spin transfer torque and magnetoresistance in magnetic multilayers, J. Phys: Condens. Matter 19 (2007) 165212, 42 pp.

Mangin, S. et al., Current-induced magnetization reversal in nanopillars with perpendicular anisotropy, Nature Materials, vol. 5, Mar. 2006, pp. 210-215.

Wetzels, W. Interaction effects in spin-valve structures, Casimir PhD Series, Delft-Leiden, Mar. 2007, 117 pp.

Stiles, M.D. et al., Phenomenological Theory of Current-Induced Magnetization Precession, 16 pp.

Jeong, W.C. et al., Field assisted spin switching in magnetic random access memory, Samsung Electronics Co., Ltd., 14 pp.

Boulle, O. et al., Shaped Angular dependence of the spin transfer torque and microwave generation without magnetic field, 17 pp.

Wei, Z. et al., Spin transfer in an antiferromagnet, 5 pp.

Rivkin, K. et al., Switching spin valves using r.f. currents, 15 pp.

Yang, T. et al., Influence of capping layer on the current-induced magnetization switching in magnetic nanopillars, J. Appl Phys. 99, 073708 (2006), 5 pp.

Ji, Y. et al., Current-induced spin-wave excitations in a single ferromagnetic layer, 4 pp.

Nozieres, J.P., Magnetic Random Access Memories (M-RAM): A truly universal memory?, SPINTEC, 8 pp.

Dieny, B., Spintronics, Hong Kong Critical Components Manufacturing Industry Quarterly Journal (Jun. 2002), 4 pp.

Dieny, B., Spin-Valves, 104 pp.

Karabacak, T. et al., Enhanced Step Coverage of Thin Films on Patterned Substrates by Oblique Angle Physical Vapor Deposition, May 22, 2004, 21 pp.

Yoda, H. et al., 1.8 V Power Supply 16 Mb-MRAMs With 42.3% Array Efficiency, IEEE Transactions on Magnetics, vol. 42, No. 10, Oct. 2006, pp. 2724-2726.

Engel, B.N. et al., A 4-Mb Toggle MRAM Based on a Novel Bit and Switching Method, IEEE Transactions on Magnetics, vol. 41, No. 1, Jan. 2005, pp. 132-136.

Tsuji, K. et al., 0.1 um-rule MRAM Development using Double-Layered Hard Mask, IEEE, IEDM 01-799-802.
Dittrich, R. et al., Energy barriers in magnetic random access memory elements, IEEE, 3 pp.
Slaughter, J. et al., MRAM Technology: Status and Future Challenges, Cornell CNS Nanotechnology Symposium, May 14, 2004, 45 pp.
Dave, Renu W., et al., MgO-Based Tunnel Junction Material for High-Speed Toggle Magnetic Random Access Memory, IEEE Transactions on Magnetics, vol. 42, No. 8, Aug. 2006. pp. 1935-1939.
Ju, K. et al., Multibit Cells Schemes for Toggle MRAM Applications, IEEE Transactions on Magnetics, vol. 42, No. 10, Oct. 2006, pp. 2730-2732.
Tehrani, S., Magnetoresistive RAM, Freescale Semiconductor, Jul. 17, 2007, 27 pp.
Boeve, H. et al., Technology assessment for the implementation of magnetoresistive elements with semiconductor components in magnetic random access memory (MRAM) architecture, IEEE Transactions on Magnetics, vol. 35, No. 5, Sep. 1999, pp. 2820-2825.
Schrefl, T. et al., Micromagnetic Simulations and Applications, Vienna University of Technology, 5 pp.
Kasai, S. et al., Current-driven resonant excitation of magnetic vortex, 16 pp.
Pribiag, V.S. et al., Magnetic vortex oscillator driven by dc spin-polarized current, Cornell University, 14 pp.
Acremann, Y. et al., Time Resolved Imaging of Spin Transfer Switching: Beyond the Macro-Spin Concept, PRL 96, 217202 (2006), 4 pp.
Ohldag, H. et al., Interfacial Moments in Co/NiO Origins of Antiferromagnetic/Ferromagnetic Coupling, 1 large page.
Ultrafast Magnetic Switching of Nanoelements with Spin Currents, Spin Injection, 8 pp.
Stohr, J., Probing the Ultrafast Magnetic Nanoworld with X-Rays, Stanford Synchrotron Radiation Laboratory, Stanford University, 43 pp.
Stohr, J., Soft X-Ray Science—From Photon Drought to Free Electron Lasers, Stanford Synchrotron Radiation Laboratory, 30 pp.
Stohr, J., The Magic of Magnetism: From Physical Attraction to Spin Doctors, Stanford Synchrotron Radiation Laboratory, Stanford Linear Accelerator Center, 45 pp.
Urban, R. et al., Gilbert Damping in Single and Multilayer Ultrathin Films: Role of Interfaces in Nonlocal Spin Dynamics, PRB, vol. 87, No. 21, 4 pp.
Fuchs, G.D. et al., Adjustable spin torque in magnetic tunnel junctions with two fixed layers, Appl. Phys. Lett. 86, 152509 (2005), 3 pp.
Petukhov, A.G. et al., 100% spin accumulation in non-half-metallic ferromagnet-semiconductor junctions, J. Phys.: Condens. Matter 19 (2007) 315205, 16 pp.
Bowen, M. et al., Using half-metallic manganite interfaces to reveal insights into spintronics, J. Phys: Condens. Matter 19 (2007) 315208, 27 pp.
Galanakis, I. et al., Spin-polarization and electronic properties of half-metallic Heusler alloys calculated from first principles, J. Phys., Condens. Matter 19 (2007) 315213, 16 pp.
Chen, T.Y. et al., Current-Driven Switching in a Single Exchange-Biased Ferromagnetic Layer, 3 pp.
Isogami, S. et al., Current-Induced Magnetization Switching and CPP-GMR in 30 nm o/ Scale Spin Valves Fabricated Using EB-Assisted CVD Hard Masks, IEEE Transactions on Magnetics, vol. 42, No. 10, Oct. 2006, pp. 2676-2678.
Chen, T.Y. et al., Current-Driven Switching in a Single Exchange-Biased Ferromagnetic Layer, J. Appl. Phys. 97, 10C709 (2005) 3 pp.
Craig, B.R. et al., The effect of roughness on the micromagnetic properties of high moment multilayer films, J. Phys. D: Appl. Phys. 40 (2007), pp. 3991-3997.
Park, C. et al., Effect of Adjacent Layers on Crystallization and Magnetoresistance in CoFeB/MgO/CoFeB Magnetic Tunnel Junction, IEEE Transactions on Magnetics, vol. 42, No. 10, Oct. 2006, pp. 2639-2641.
Kim, K-S et al., Effect of Nitrogen Incorporation to Oxidation Process on the Reliability of Magnetic Tunnel Junctions, IEEE Transactions on Magnetics, vol. 42, No. 1, Jan. 2006, pp. 2-4.
Yang, T. et al., Estimation of local and nonlocal contributions to the current-induced magnetization switching, Phys. Rev. B 74, 153301 (2006), 4 pp.
MacGillivray, G., Flash Memory Trends & Perspectives, Semiconductor Insights, 24 pp.
Marukame, T. et al., Highly Spin-Polarized Tunneling in Fully Epitaxial Magnetic Tunnel Junctions Using Full-Heusler Alloy Co2Cr0.6Fe0.4Al Thin Film and MgO Tunnel Barrier, IEEE Transactions on Magnetics, vol. 42, No. 10, Oct. 2006, pp. 2652-2654.
Tsunekawa, K. et al., Huge Magnetoresistance and Low Junction Resistance in Magnetic Tunnel Junctions With Crystalline MgO Barrier, IEEE Transactions on Magnetics, vol. 42, No. 2, Feb. 2006, pp. 103-107.
Boslet, M., IBM to reveal chip advance, Nanotechnology Boosts Products' Speed, Efficiency, Mercury News, 3 pp.
Sharma, M. et al., Inversion of Spin Polarization and Tunneling Magnetoresistance in Spin-Dependent Tunneling Junctions, Physical Review Letters, vol. 82, No. 3, Jan. 18, 1999, pp. 616-619.
Guhr, I.L. et al., Magnetization reversal in exchange biased nanocap arrays, J. Phys. D: Appl. Phys. 40 (2007), pp. 3005-3010.
Ohsawa, Y., Magnetoresistance and Current-Driven Resistance Change Measurements in NiFe Film With a Nanoconstriction, IEEE Transactions on Magnetics, vol. 42, No. 10, Oct. 2006, pp. 2615-2617.
Mendes, M.J., Manipulation of Magnetization by Spin Polarized Current in GMR Devices, Rice University, Nanostructures and Nanotechnology I, Fall 2005, 12 pp.
Lee, J. et al., Nano Spin Transistor, 33 pp.
Braganca, P.M. et al., Reducing the critical current for short-pulse spin-transfer switching of nanomagnets, Appl. Phys. Lett. 87, 112507 (2005), 3 pp.
Chen, S-P. et al., Spin Accumulation from the Spin Hall Effect Studied Using the Effective Mean-Free-Path Model, IEEE Transactions on Magnetics, vol. 42, No. 10, Oct. 2006, pp. 2667-2669.
Zheng, Y.K. et al., Spin Flop Switching of the Guided Synthetic Antiferromagnet MRAM, IEEE Transactions on Magnetics, vol. 42, No. 10, Oct. 2006, pp. 2742-2744.
Joly, L. et al., Spin Motion of Electrons Upon Reflecting From Ferromagnetic Surfaces, IEEE Transactions on Magnetics, vol. 42, No. 10, Oct. 2006, pp. 2645-2648.
Zhu, X. et al., Spin Torque and Field-Driven Perpendicular MRAM Designs Scalable to Multi-Gb/Chip Capacity, IEEE Transactions on Magnetics, vol. 42, No. 10, Oct. 2006, pp. 2739-2741.
Albert, F.J. et al., Spin-polarized current switching of a Co thin film nanomagnet, Appl. Phys. Lett., vol. 77, No. 23, Dec. 4, 2000, pp. 3809-3811.
Zutic, I. et al., Spintronics: Fundamentals and applications, Reviews of Modern Physics, vol. 76, Apr. 2004, pp. 323-410.
Jin, W. et al., Spin-Wave Excitations in Nanopillars With Perpendicular Polarizers, IEEE Transactions on Magnetics, vol. 42, No. 10, Oct. 2006, pp. 2682-2684.
Shimomura, N. et al., Switching Current Fluctuation and Repeatability for MRAM With Propeller-Shape MTJ, IEEE Transactions on Magnetics, vol. 42, No. 10, Oct. 2006, pp. 2757-2759.
Apalkov, D. et al., Temperature Dependence of Spin Transfer Switching in Nanosecond Regime, IEEE Transactions on Magnetics, vol. 42, No. 10, Oct. 2006, pp. 2685-2687.
Kumar, S.B. et al., The Effect of Spreading Resistance on the Magnetoresistance of Current-Perpendicular-to-Plane Spin Valves With Patterned Layers, IEEE Transactions on Magnetics, vol. 42, No. 10, Oct. 2006, pp. 3788-3790.
Serpico, C. et al., Thermal Stability in Uniaxial Nanomagnets Driven by Spin-Polarized Currents, IEEE Transactions on Magnetics, vol. 42, No. 10, Oct. 2006, pp. 2679-2681.
Daibou, T. et al., Tunnel Magnetoresistance Effect in CoFeB/MgO/CoxFeSi and Co2MnSi Tunnel Junctions, IEEE Transactions on Magnetics, vol. 42, No. 10, Oct. 2006, pp. 2655-2657.
Stine, B.E. et al., The Physical and Electrical Effects of Metal-Fill Patterning Practices for Oxide Chemical-Mechanical Polishing Processes, IEEE Transactions on Magnetics, vol. 45, No. 3, Mar. 1998, pp. 665-679.

Lee, J.W. et al., A Planarization Model in Chemical Mechanical Polishing of Silicon Oxide Using High Selective CeO2 Slurry, Samsung Electronics, 1 p.
Nguyen, V.H. et al., Hybrid CMP process for copper and ultra low-k materials integration, 2 pp.
Zhang, J. et al., Automated Process Control of Within-Wafer and Wafer-to-Wafer Uniformity in Oxide CMP, CMP-MIC Mar. 2002, 6 pp.
Karuppiah, L. et al., Overview of CMP Process Control Strategies, Applied Materials, TFG Division, Sunnyvale, CA, 10 pp.
Wijekoon, K. et al., Minimization of Metal Loss during Chemical Mechanical Planerization of Copper-Oxide and Copper-Low k Damascene Structures, CMP-MIC Mar. 2002, 4 pp.
Healey, J., Current Technical Trends: Dual Damascene & Low-k Dielectrics, Threshold Systems, 2002, 6 pp.
Lai, J-Y et al., Evolution of Copper-Oxide Damascene Structures in Chemical Mechanical Polishing, J. Electrochem. Soc., 149 (1), 2002, pp. G41-G50.
Chen, L., Breakthrough technology for CMP, Semiconductor Fabtech—24th Ed., pp. 137-141.
Araswat, EE311/Cu Interconnect, Stanford University, 18 pp.
Chang, R.Z. et al., Modeling the electrical effects of metal dishing due to CMP for on-chip interconnect optimization, University of California Postprints, 2004, Paper 52, 9 pp.
Wolf, P.J., Overview of Dual Damascene Cu/Low-k Interconnect, International Sematech, Aug. 14, 2003, 21 pp.
Buehler, M., CMP Challenges for 32nm, Semicon West 2007, Jul. 2007, 21 pp.
Lai, J-Y, Mechanics, Mechanisms, and Modeling of the Chemical Mechanical Polishing Process, MIT, Feb. 2001, 314 pp.
Wallace, R.M., New Devices and Materials for 32nm and Beyond, Semicon West 2007, 15 pp.
Technology backgrounder: High-k gate oxides, IC Knowledge 2002, 3 pp.
Hoover, C., Enabling Materials for Contact Metallization, Advanced Processes for Advanced Devices, Jul. 2007, 16 pp.
Stokbro, K., Nanoelectronics modeling platform, Atomisitx Inc., 12 pp.
Arghavani, R., Technologies to Enable High-k/Metal Gate Implementation, Semicon West 2007, Jul. 17, 2007, 20 pp.
The Microscopic Twelve Point Probe, Capres A/S, 1 p.
Petersen, C.L., The Four-Point Probe, Thesis at the Technical University of Denmark, Feb. 1999, 110 pp.
SPM-CIPTech, APRES A/S, 1 p.
SPC-CIPTech (Ver. 3) Technical Specifications (rev. Jan. 2006), 4 pp.
Karpan, V.M. et al., Graphite and graphene as perfect spin filters, Feb. 1, 2007, 5 pp.
Cherian, J.G., Quantum Electrodynamics in Graphene, Kutztown University of PA, Physics REU 2006, Univ. of Washington, 13 pp.
Parkin, S., Magnetic Race-Track Memory: Current Induced Domain Wall Motion!, IBM Corporation, 2005, 60 pp.
Hajto, J. et al., Quantized Electron Transport in Amorphous-Silicon Memory Structures, Phys. Rev. Lett., vol. 66, No. 14, Apr. 8, 1991, pp. 1918-1921.
Rossel, C. et al., Electrical current distribution across a metal-insulator-metal structure during bistable switching, J. Appl. Phys., vol. 90, No. 6, Sep. 15, 2001, pp. 2892-2898.
Yuasa, S. et al., Characterization of growth and crystallization processes in CoFeB/MgO/CoFeB magnetic tunnel junction structure by reflective high-energy electron diffraction, Appl. Phys. Lett. 87, 242503 (2005), 3 pp.
Hayakawa, J. et al., Dependence of Giant Tunnel Magnetoresistance of Sputtered CoFeB/MgO/CoFeB Magnetic Tunnel Junctions on MgO Barrier Thickness and Annealing Temperature, JJAP, vol. 44, No. 19, 2005, pp. L587-L589.
Hayakawa, J. et al., Effect of high annealing temperature on giant tunnel magnetoresistance ratio of CoFeB/MgO/CoFeB magnetic tunnel junctions, Appl. Phys. Lett. 89, 232510 (2006), 3 pp.
Lee, Y.M. et al. Giant tunnel magnetoresistance and high annealing stability in CoFeB/MgO/CoFeB magntic tunnel junctions with synthetic pinned layer, Appl. Phys. Lett. 89, 042506 (2006), 3 pp.
FEI Company Product Data, VectraVision System, FIB System for Advanced Circuit Editing, 2003, 4 pp.

FEI Company, Tools for Nanotech, CoppeRx II for Mixed-Field FIB Deprocessing, 2006, 1 p.
MoberlyChan, W.J. et al., Fundamentals of Focused Ion Beam Nanostructural Processing: Below, At, and Above the Surface, MRS Bulletin, vol. 32, May 2007, pp. 414-432.
Abstracts, 52nd Magnetism and Magnetic Materials Conference, Nov. 2007, 143 pp.
Zhu, J., Microwave-assisted magnetic recording, International Storage Technology Symposium, Jun. 18-21, 2007, 35 pp.
Kryder, M.H., Perspective on Future Storage Technologies, International Storage Technology Symposium, Jun. 18-21, 2007, 35 pp.
Wood, R. et al., From Rotating- to Solid-State- to 3D-Storage?, Brainstorming the Future, International Storage Technology Symposium, Jun. 18-21, 2007, 6 pp.
Rosen, H., Nano-Bio-Magnetic Horizons, International Storage Technology Symposium, Jun. 18-21, 2007, 14 pp.
Komineas, S., Propagating Coherent Structures in Nanowires, International Storage Technology Symposium, Jun. 18-21, 2007, 12 pp.
Knight, G., Probe-Based Storage: Mechanical Access on a Nano-Scale, International Storage Technology Symposium, Jun. 18-21, 2007, 16 pp.
Knight, G., Semiconductor/Flash Memory Overview, International Storage Technology Symposium, Jun. 18-21, 2007, 19 pp.
Theodonis, I., Spin Transfer Torque (STT) in Magnetic Tunnel Junctions, International Storage Technology Symposium, Jun. 18-21, 2007, 21 pp.
Rohrmann, H., Multilayer and Granular Films on Nanospheres, International Storage Technology Symposium, Jun. 18-21, 2007, 41 pp.
Pearton, S.J. et al., Dry Etching of MRAM Structures, Mat. Res. Soc. Symp. Proc., vol. 614, 2000, 11 pp.
Yung, R.B. et al., Control of Chlorine Inductively Coupled Plasma Using Optical-Emission Spectroscopy, J. Elec. Mat., vol. 31, No. 10, 2002, pp. 994-998.
Ditizio, R. et al., Memory: MRAM Design, Cell Shape and Patterning Considerations for Magnetic Random Access Memory (MRAM) Fabrication, Semiconductor Manufacturing Magazine, pp. 90-96.
Wong, D.F. et al., Magnetic mesa structures fabricated by reactive ion etching with CO/NH3/Xe plasma chemistry for an all-silicon quantum computer, Nanotechnology 16 (2005), pp. 990-994.
Lee, J.W. et al., High-density plasma etching of CoFeSiB magnetic films with hard mask, Journal of Magnetism and Magnetic Materials 304 (2006), pp. c282-c284.
Mukai, T. et al., High-Performance and Damage-Free Magnetic Film Etching using Pulse-Time-Modulated Cl2 Plasma, Jpn. J. Appl. Phys., vol. 45, No. 6B (2006), pp. 5542-5544.
Park, I.H. et al., Nanometer-sized etching of magnetic tunnel junction stack for magnetic random access memory, Journal of Magnetism and Magnetic Materials 304 (2006), pp. c264-c266.
Ruzic, D., Highlights in Plasma Science from around the world, Plasma Material Interaction Group, Univ. of Illinois, Sep. 2006, 55 pp.
Shin, B. et al., Etch Characteristics of CoFeSiB Magnetic Films Using Inductively Coupled Plasma Reactive Ion Etching for Magnetic Random Access Memory, Integrated Ferroelectrics 78, 2006. pp. 223-243.
Takahashi, S. et al., Ion-Beam-Etched Profile Control of MTJ Cells for Improving the Switching Characteristics of High-Density MRAM, IEEE Transactions on Magnetics, vol. 42, No. 10, Oct. 2006, pp. 2745-2747.
Plasma Lab C.Y.C.U., 26 pp.
Etching, Feb. 20, 2005, 110 pp.
ISSCC—2007: Hitachi/Tohuku Univ; Paper D26-5, 12 pp.
Reactive Ion Etching of Magnetic Materials, ISSCC-2007: Hitachi/Tohuku Univ; Paper D26-5, 12 pp.
Rack, P.D., Plasma Etching Outline, Univ. of Tennessee, 34 pp.
An Introduction of Etch Process, Hynix, 69 pp.
Ricci, A., Dry Etch Process Application Note, Pall Microelectronics ABG-106-0405, 6 pp.
Volkert, C.A. et al., Focused Ion Beam Microscopy and Micromachining, MRS Bulletin, vol. 32, May 2007, pp. 389-400.
Mayer, J. et al., TEM Sample Preparation and FIB-Induced Damage, MRS Bulletin, vol. 32, May 2007, pp. 400-407.

Jung, K.B. et al., Electron Cyclotron Resonance Plasma Etching of Materials for Magneto-Resistive Random Access Memory, J. Elec. Mater., vol. 26, No. 11, 1997, pp. 1310-1313.

Balke, B. et al., Mn3Ga, a compensated ferrimagnet with high Curie temperature and low magnetic moment for spin torque transfer applications, Appl. Phys. Lett. 90, 152504 (2007), 3 pp.

Demidov, V.E. et al., Effect of spin-polarized electric current on spin-wave radiation by spin-valve nanocontacts, Appl. Phys. Lett. 90, 172508 (2007), 3 pp.

Laribi, S. et al., Reversible and irreversible current induced domain wall motion in CoFeB based spin valves stripes, Appl. Phys. Lett. 90, 232505 (2007), 3 pp.

V600FIB System, The Most Efficient, Flexible and Cost-effective Device Modification Tool Available for Today's Semiconductor Lab, FEI Company Product Data 2006, 4 pp.

Seo, S-M. et al., Effect of shape anisotropy on threshold current density for current-induced domain wall motion, Appl. Phys. Lett. 90, 252508 (2007), 3 pp.

CMP Technology, 14 pp.

Zhang, S., Current research in current-driven magnetization dynamics, University of Missour-Columbia, Feb. 14, 2006, 48 pp.

Mahorowala, A. et al., Etching of polysilicon in an Inductively Coupled Cl2 and HBr Discharges: III. Photoresist Mask Faceting, Sidewall Deposition, and Microtrenching, Mass. Inst. of Technology, 19 pp.

Consolo, G. et al., Influence of Different Spatial Distributions of Current Density and Spin-Torque Efficiency in the Dynamics of Point-Contact Devices, IEEE Transactions on Magnetics, vol. 43, No. 6, Jun. 2007, 2827-2829.

Guo, J. et al., Effect of Gilbert Damping Term on the Current Induced Magnetization Switching of Ring-Shaped Spin Valve Structures, IEEE Transactions on Magnetics, vol. 43, No. 6, Jun. 2007, 2923-2925.

Lee, J.M. et al., Spin Transfer Magnetization Switching Read/Write Cycle Test in MgO-Based Magntic Tunnel Junctions, IEEE Transactions on Magnetics, vol. 43, No. 7, Jul. 2007, 3349-3353.

Zhu, X. et al., Effect of Damping Constant on Magnetic Switching in Spin Torque Driven Perpendicular MRAM, IEEE Transactions on Magnetics, vol. 43, No. 6, Jun. 2007, 2349-2351.

Myers, E.B. et al., Interplay of Spin-Transfer Torques and Thermal Activation in Nanomagnet Reversal, Cornell University, 14 pp.

Lithography, Lecture 15 (Alignment and Exposure), Semiconductor Manufacturing Technology, Chapters 13-15, 71 pp.

delMoral, A., Magnetostriction: fundamental principles and novel magneto-strictive materials, Europhysics News (2003) vol. 34, No. 6., 9 pp.

T. Sek et al.; Spin-polarized current-induced magnetization reversal in perpendicularly magnetized L10-FePt layers; Applied Physics Letters; 88, 172504 2006 ; Apr. 25, 2006.

Yingfan, Xu et al.; In situ ordering of FePt thin films with face-centered-tetragonal 001 texture on Cr100ÅxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

Lammers, D., MRAM debut cues memory transition, Jul. 10, 2006, 1 p.

Edwards, D.M., et al., Theory of spin current in magnetic nanopillars for zero-field microwave generation, J. Phys.: Condens. Matter 19 (2007) 165210, 8 pp.

Economikos, L. et al., STI Planarization Using Fixed Abrasive Technology, Feb. 2, 2002, 1 p.

Cu Damascene Process, 6 pp.

Parkin, S., The Spin on Electronics!, Jan. 29, 2008, 1 p.

Barnas, J. et al., Current-induced switching in spin-valve structures, phys. stat. sol. (b) 244, No. 7, pp. 2304-2310.

Carpentieri, M. et al., Micromagnetic Investigation of Precession Dynamics in Magnetic Nanopillars, IEEE Transactions on Magnetics, vol. 43, No. 6, Jun. 2007, pp. 2935-2937.

He, J. et al., Switching speed distribution of spin-torque-induced magnetic reversal, J. Appl. Phys. 101, 09A501 (2007), 3 pp.

Persson, J. et al., Phase-locked spin torque oscillators: Impact of device variability and time delay, J. Appl. Phys. 101, 09A503 (2007), 3 pp.

Kim, W.J. et al., Effect of ac on current-induced domain wall motion, J. Appl. Phys. 101, 09A504 (2007), 3 pp.

Serpico, C. et al., Power spectrum of current-induced magnetization dynamics in uniaxial nanomagnets, J. Appl. Phys. 101, 09A507 (2007), 3 pp.

Finocchio, G. et al., Magnetization dynamics in CoFe/AlO/Permalloy and CoFe/MgO/Permalloy magnetic tunnel junctions, J. Appl. Phys. 101, 09A508 (2007), 3 pp.

Zhou, Y. et al., Intrinsic phase shift between a spin torque oscillator and an alternating current, J. Appl. Phys. 101, 09A510 (2007), 3 pp.

Consolo, G. et al., Influence of the Oersted field in the dynamics of spin-transfer microwave oscillators, J. Appl. Phys. 101, 09C108 (2007), 3 pp.

Devolder, T. et al., Spin transfer oscillators emitting microwave in zero applied magnetic field, J. Appl. Phys. 101, 063916 (2007), 5 pp.

Maat, S. et al., Magnetotransport propeties and spin-torque effects in current perpendicular to the plane spin valves with Co-Fe-Al magnetic layers, J. Appl. Phys. 101, 093905 (2007), 6 pp.

Jalil, M.B.A. et al, Layer thickness and angular dependence of spin transfer torque in ferromagnetic trilayers, J. Appl. Phys. 101, 124314 (2007), 4 pp.

Mizushima, K. et al., Analytical expression of output power spectra of spin-transfer nano-oscillators, Journal of Magnetism and Magnetic Materials 316 (2007) c960-c962.

Meier, G. et al., Current-induced domain-wall motion in permalloy semi rings, Journal of Magnetism and Magnetic Materials 316 (2007) c966-c968.

Slonczewski, J.C. et al., Theory of voltage-driven current and torque in magnetic tunnel junctions, Journal of Magnetism and Magnetic Materials 310 (2007) 169-175.

Consolo, G. et al., Spin-torque switching in Py/Cu/Py and Py/Cu/CoPt spin-valve nanopillars, Journal of Magnetism and Magnetic Materials 316 (2007) 492-495.

Houssameddine, D. et al., Spin-torque oscillator using a perpendicular polarizer and a planar free layer, Nature Materials, vol. 6, Jun. 2007, pp. 447-453.

Kent, A., A nanomagnet oscillator, Nature Materials, vol. 6, Jun. 2007, pp. 399-400.

Boulle, O. et al., Shaped angular dependence of the spin-transfer torque and microwave generation without magnetic field, Nature Physics, vol. 3, Jul. 2007, pp. 492-497.

Pribiag, V.S. et al., Magnetic vortex oscillator driven by d.c. spin-polarized current, Nature Physics, vol. 3, Jul. 2007, pp. 498-503.

Vanhaverbeke, A. et al., Simple model of current-induced spin torque in domain walls, Physical Review B 75, 024411 (2007), 5 pp.

Devolder, T. et al., Distribution of the magnetization reversal duration in subnanosecond spin-transfer switching, Physical Review B 75, 064402 (2007), 5 pp.

Pareek, T.P., Spin-orbit-induced torque in a collinear spin valve: A possible route to design fast magnetic memory, Physical Review B 75, 115308 (2007), 6 pp.

Pufall, M.R. et al., Low-field current-hysteretic oscillations in spin-transfer nanocontacts, Physical Review B 75, 140404 (R) (2007), 4 pp.

Berger, L., Relation between damping, current-induced torques, and wall resistance for domain walls in magnetic nanowires, Physical Review B 75, 174401 (2007), 5 pp.

Yang, S. et al., Spin-transfer-torque-driven domain-wall dynamics in Permalloy nanowires, Physical Review B 75, 220403(R) (2007), 4 pp.

Wei, Z. et al., Changing Exchange Bias in Spin Valves with an Electric Current, PRL 98, 116603 (2007), 4 pp.

Lee, Y.M. et al., Giant tunnel magnetoresistance and high annealing stability in CoFeB/MgO/CoFeB magnetic tunnel junctions with synthetic pinned layer, Appl. Phys. Lett. 89, 042506 (2006), 3 pp.

Yang, T. et al., Current-induced vortex-vortex switching in a nanopillar comprising two Co nano-rings, Appl. Phys. Lett. 90, 092505 (2007), 3 pp.

Xi, H. et al., Spin waves excited by dc currents injected into single ferromagnetic thin films, Phys. Rev. B 75, 174411 (2007), 8 pp.

Consolo, G. et al., Magnetization dynamics in nanocontact current controlled oscillators, Phys. Rev. B 75, 214428 (2007), 6 pp.

SpinAps Agenda, Abstracts, Mar. 17-19, 2006.

Tsoi, M., et al, Magnetic domain wall motion triggered by an electric current, App. Phys. Letters, vol. 83, No. 13, Sep. 29, 2003, 2617-2619.

Thiaville, A., et al., Micromagnetic understanding of current-driven domain wall motion in patterned nanowires, Europhys. Lett 69 (6), Mar. 15, 2005, pp. 990-996.

Shibata, J., et al., Current-induced magnetic vortex motion by spin-transfer torque, Physical Review B 73, 020403(R) (2006), 4 pp.

Yamaguchi, A., et al., Reduction of threshold current density for current-driven domain wall motion by shape control, 16 pp.

Kimura, T., et al., Spin-current-assisted domain-wall depinning in a submicron magnetic wire, J. App. Phys., vol. 94, No. 12, Dec. 15, 2003, pp. 7947-7949.

Grollier, J., et al., Switching a spin-valve back and forth by current-induced domain wall motion, 4 pp.

Grollier, J., et al., Switching the magnetic configuration of a spin valve by current-induced domain wall motion, J. App. Phys., vol. 92, No. 8, Oct. 15, 2002, pp. 4825-4827.

Gomez, R.D., et al., An approach to Wearable Magnetic Random Access Memory, ECE Dept., University of Maryland, 12 pp.

Hajto, J., et al., Quantized Electron Transport in Amorphous-Silicon Memory Structures, Physical Review Letters, vol. 66, No. 14, Apr. 8, 1991, pp. 1918-1921.

Rossel, C., et al., Electrical current distribution across a metal-insulator-metal structure during bistable switching, J. Appl. Phys., vol. 90, No. 6, Sep. 15, 2001, pp. 2892-2898.

DeBrosse, J., Circuit Considerations for Spin-Switched MRAM Devices, IBM Microelectronics, May 14, 2004, 15 pp.

Maffitt, T.M., et al., Design considerations for MRAM, IBM J. Res. & Devl., vol. 50, No. 1, Jan. 2006, pp. 25-39.

Gallagher, W. J. et al., Development of the magnetic tunnel junction MRAM at IBM: From first junctions to a 16-Mb MRAM demonstrator chip, IBM J. Res. & Devl., vol. 50, No. 1, Jan. 2006, pp. 5-23A.

Jiang, X., et al., Highly efficient room-temperature tunnel spin injector using CoFe/MgO(001), IBM J. Res. & Dev., vol. 50, No. 1, Jan. 2006, pp. 111-120.

Parkin, Stuart, Magnetic Race-Track Memory: Current Induced Domain Wall Motion!, IBM Research, 2006, 60 pp.

Abraham, D.W., Rapid-turnaround characterization methods for MRAM development, IBM J. Res. & Dev., vol. 50, No. 1, Jan. 2006, pp. 55-67.

Worledge, D.C., Single-domain model for toggle MRAM, IBM J. Res. & Dev., vol. 50, No. 1, Jan. 2006 pp. 69-79.

Sun, J.Z., Spin angular momentum transfer in current-prpendicular nanomagnetic junctions, IBM J. Res. & Dev., vol. 50, No. 1, Jan. 2006, pp. 81-100.

Wolf, S.A., Spintronics—A retrospective and perspective, IBM J. Res. & Dev., vol. 50, No. 1, Jan. 2006, pp. 101-110.

Gaidis, M.C., Two-level BEOL processing for rapid iteration in MRAM development, IBM J. Res. & Dev., vol. 50, No. 1, Jan. 2006, pp. 41-54.

Ikeda, S., Magnetic Tunnel Junctions for Spintronic Memories and Beyond, IEEE Trans. on Electron Devices, vol. 54., No. 5, May 2007, pp. 991-1002.

Johnson, M., Optimized Device Characteristics of Lateral Spin Valves, IEEE Trans. on Electron Devices, vol. 54., No. 5, May 2007, pp. 1024-1031.

Tanaka, M., et al., MOS-Based Spin Devices for Reconfigurable Logic, IEEE Trans. on Electron Devices, vol. 54., No. 5, May 2007, pp. 961-976.

Bibes M., et al., Oxide Spintronics, IEEE Trans. on Electron Devices, vol. 54., No. 5, May 2007, pp. 1003-1023.

Van Roy, W., et al., Spin Injection and Detection in Semiconductors—Electrical Issues and Device Aspects, IEEE Trans. on Electron Devices, vol. 54., No. 5, May 2007, pp. 933-944.

Sanchez, David, et al., Spin-Polarized Transport in II-VI Magnetic Resonant-Tunneling Devices, IEEE Trans. on Electron Devices, vol. 54., No. 5, May 2007, pp. 984-990.

Nitta, J. et al., Electrical Manipulation of Spin Precession in an InGaAs-Based 2DEG Due to the Rashba Spin-Orbit Interaction, IEEE Trans. on Electron Devices, vol. 54., No. 5, May 2007, pp. 955-960.

Flatte, M.E., Spintronics, IEEE Trans. on Electron Devices, vol. 54., No. 5, May 2007, pp. 907-920.

Gould, C. et al., Tunneling Anisotropic Magnetoresistance-Based Devices, IEEE Trans. on Electron Devices, vol. 54., No. 5, May 2007, pp. 977-983.

Pearton, S.J., et al., ZnO Doped With Transition Metal Ions, IEEE Trans. on Electron Devices, vol. 54., No. 5, May 2007, pp. 1040-1048.

Seneor, P. et al., Nanospintronics: when spintronics meets single electron physics, J. Phys: Condens. Matter 19 (2007) 22 pp.

Ernult, F. et al., Spin accumulation in metallic nanoparticles, J. Phys: Condens. Matter 19 (2007) 19 pp.

Dieny, B. et al., Spin Electronics, J. Phys: Condens. Matter 19 (2007) 3 pp.

Kimura, T. et al., Spin transport in lateral ferromagnetic/nonmagnetic hybrid structures, J. Phys: Condens. Matter 19 (2007) 13 pp.

Tiusan, C. et al., Spin tunnelling phenomena in single-crystal magnetic tunnel junction systems, J. Phys: Condens, Matter 19 (2007) 35 pp.

Diao, Z. et al., Spin-transfer forque switching in magnetic tunnel junctions and spin-transfer torque random access memory, J. Phys: Condens. Matter 19 (2007) 13 pp.

Attema, J.J., et al, Spintronic materials based on main-group elements, J. Phys: Condens. Matter 19 (2007) 11 pp.

Moodera, J.S. et al., The phenomena of spin-filter tunnelling, J. Phys: Condens. Matter 19 (2007) 24 pp.

Ding, Y. et al., Fabrication of current-induced magnetization switching devices using etch-back planarization process, J. Appl. Phys. 97 (2005) 3 pp.

Meng, H. et al., Low resistance spin-dependent magnetic tunnel junction nwith high breakdown voltage for current-induced magnetization-switching devices, J. Appl. Phys. 97 (2005) 3 pp.

Meng, H., Spin Transfer with Low Switching Current Density, University of Minnesota, 2002 MINT Review, 14 pp.

Meng, H. et al., Spin Transfer Effect in Magnetic Tunnel Junction with Nano-Current-Channel, University of Minnesota InterMag 2005, 14 pp.

Meng, H. et al., Composite free layer for high density magnetic random access memory with lower spin transfer current, Appl. Phys. Letters 89 (2006) 3 pp.

Meng, H. et al., Spin Transfer in nanomagnetic devices with perpendicular anisotropy, Appl. Phys. Letters 88 (2006) 3 pp.

Meng, H. et al., A Composite Free Layer for High Density Magnetic Random Access Memory with Lower Spin Transfer Current, Submitted to Appl. Phys. Letters, May 2006, 14 pp.

Meng, H. et al., Spin Transfer Effect in Magnetic Tunnel Junction With a Nano-Current-Channel Layer in Free Layer, IEEE Trans. on Magnetics, vol. 41, No. 10, Oct. 2005, pp. 2612-2614.

Meng, H. et al., Spin Transfer Effect in Magnetic Tunnel Junction with Low Resistance, The Center for Micromagnetic and Information Technology (MINT) & Department of Electrical & Computer Engineering, University of Minnesota, 2 pp.

Meng, H. et al., A New Memory Cell Structure for MRAM with Low Writing Threshold, MMM 2005, University of Minnesota, 13 pp.

Meng, H. et al., Spin Transfer in Magnetic Nano Devices with Perpendicular Anisotropy, MMM 2005, University of Minnesota, 13 pp.

Meng, H. et al., Low critical current for spin transfer in magnetic tunnel junctions, Appl. Phys. Letters 88 (2006) 3 pp.

Meng, H. et al., A New Memory Cell Structure for Magnetic Random Access Memory with Low Writing Threshold, The Center for Micromagnetic and Information Technology (MINT) & Department of Electrical & Computer Engineering, University of Minnesota, 1 p.

Wang, J.-P. et al., Spin Transfer in Magnetic Nano Devices with Perpendicular Anisotropy, University of Minnesota, 2006 APS A-22.00011, 14 pp.

Lo, T.N. et al., E-beam lithography and electrodeposition fabrication of thick nanostructured devices, J. Phys. D: Appl. Phys 40 (2007) pp. 3172-3176.

Technology Backgrounder: Immersion Lithography, IC Knowledge 2003, 5 pp.

Martin, J.I. et al., Ordered magnetic nanostructures: fabrication and properties, J. Magnetism and Magnetic Materials 256 (2003) pp. 449-501.

Onai, T. et al., Outlook for Advanced Semiconductor Process and Manufacturing Technologies, Hitachi Review, vol. 52 (2003) No. 3, pp. 117-124.

Garner, C.M., Technology Challenges & Opportunities for Nanomaterials, 2007 ITRS Public Conference, 15 pp.

Chezan, A.R. et al., Influence of stresses and magnetostriction on the soft magnetic behavior of metallic films, J. Magnetism and Magnetic Materials 299 (2006) pp. 219-224.

Wang, D. et al., Magnetostriction Effect of Amorphous CoFeB Thin Films and Application in Spin Dependent Tunnel Junctions, NVE Corporation, 2004, pp. 1-14.

Shin, C.-S. et al., Growth, surface morphology, and electrical resistivity of fully strained substoichiometric epitaxial $TiN_x$ ($0.67<x<1.0$) layers on MgO(001), J. Appl. Phys., vol. 95, No. 1, Jan. 1, 2004, pp. 356-362.

Itoh, H., Theory of tunnel magnetoresistance and spin filter effect in magnetic tunnel junctions, J. Phys. D: Appl. Phys. 40 (2007) 1228-1233.

Liu, X. et al., Thermal stability of magnetic tunneling junctions with MgO barriers for high temperature spintronics, Appl. Phys. Lett. 89, 023504 (2006) 3 pp.

Trachenko, K. et al., How the nature of the chemical bond governs resistance to amorphization by radiation damage, Physical Review B 71, 184104 (2005) 5 pp.

Shen, W. et al., Effect of film roughness in MgO-based magnetic tunnel junctions, Appl. Phys. Lett. 88, 182508 (2006) 3 pp.

Ikeda, S. et al., Dependence of tunnel magnetoresistance in MgO based magnetic tunnel junctions on Ar pressure during MgO sputtering, 19 pp.

Miao, G-X. et al., Inelastic tunneling spectroscopy of magnetic tunnel junctions based on CoFeB/MgO/CoFeB with Mg insertion layer, J. Appl. Phys. 99, 08T305 (2006) 3 pp.

Diao, Z. et al., Spin transfer switching in dual MgO magnetic tunnel junctions, Appl. Phys. Lett. 90, 132508 (2007) 3 pp.

Padhan, P. P et al., Frequency-dependent magnetoresistance and magnetocapacitance properties of magnetic tunnel junctions with MgO tunnel barrier, Appl. Phys. Lett. 90, 142105 (2007) 3 pp.

Lee, J.M. et al., Current-Induced Magnetization Switching Probability in MgO-Based Magnetic Tunnel Junctions, IEEE Transactions on Magnetics, vol. 43, No. 2, Feb. 2007, pp. 917-919.

Kawahara, T. et al., 2Mb Spin-Transfer Torque RAM (SPRAM) with Bit-by-Bit Bidirectional Current Write and Parallelizing-Direction Current Read, ISSCC 2007, Session 26, Non-Volatile Memories, 26.5, pp. 480-481.

Lee, Y.M. et al., Giant tunnel magnetoresistance and high annealing stability in CoFeB/MgO/CoFeB magnetic tunnel junctions with synthetic pinned layer, pp. 1-17.

Dave, R.W. et al., MgO-Based Tunnel Junction Material for High-Speed Toggle Magnetic Random Access Memory, IEEE Transactions on Magnetics, vol. 42, No. 8, Aug. 2006, pp. 1935-1939.

Lee, K.J., Excitations of Incoherent Spin-Waves due to Spin-Transfer Torque, pp. 1-14.

Kiselev, S.I. et al., Current-Induced Nanomagnetic Dynamics for Magnetic Fields Perpendicular to the Sample Plane, Phys. Rev. Lett., vol. 93, No. 3, Jul. 16, 2004, 4 pp.

Sankey, J.C. et al., Mechanisms limiting the coherence time of spontaneous magnetic oscillations driven by dc spin-polarized currents, Physical Review B 72, 224427 (2005) 5 pp.

Nogi, Y. et al., Preparation and magnetotransport properties of MgO-barrier-based magnetic double tunnel junctions including nonmagnetic nanoparticles, J. Phys. D: Appl. Phys. 40 )2007) pp. 1242-1246.

Barnetson, D., QDMtm Flash Memory, Semicon West 2007, Jul. 17, 2007, 18 pp.

Ernult, F. et al., Spin accumulation in metallic nanoparticles, J. Phys.: Condens. Matter 19 (2007) 165214, 19 pp.

Hayakawa, J. et al., Current-driven switching of exchange biased spin-valve giant magnetoresistive nanopillars using a conducting nanoprobe, J. Appl. Phys., vol. 96, No. 6, Sep. 15, 2004, pp. 3440-3442.

Rippard, W.H. et al., Quantitative studies of spin-momentum-transfer-induced excitations in Co/Cu multilayer films using point-contact spectroscopy, Appl. Phys. Lett., vol. 82, No. 8, Feb. 24, 2003, pp. 1260-1262.

Chen, T.Y. et al., Current-induced switching in a single exchange-biased ferromagnetic layer, J. Appl. Phys. 97, 10C709 (2005) 3 pp.

Chen, T.Y. et al., Enhanced Magnetoresistance Induced by Spin Transfer Torque in Granular Films with a Magnetic . Field, PRL 96, 207203 (2006) 4 pp.

Chen, T. et et al., Oxygen-pressure dependence of the crystallinity of MgO films grown on Si(1 0 0) by PLD, Journal of Crystal Growth 270 (2004), pp. 553-559.

Xiao, J. et al., Macrospin models of spin transfer dynamics, Phys. Rev. B 72, 014446 (2005), 13 pp.

Stiles, M.D. et al., Phenomenological Theory of Current-Induced Magnetization Precession, Nov. 20, 2003, 16 pp.

Stiles, M.D. et al., Spin Transfer Torque and Dynamics, 85 pp.

Rippard, W.H. et al., Spin-Transfer Induced Dynamics in Magnetic Nanostructures, NIST nanomagntodynamics and DARPA SpinS program, 29 pp.

Xiao, J. et al., Spin-transfer torque for continuously variable magnetization, Phys. Rev. B 73, 054428 (2006) 10 pp.

Derbenwick, G.F. et al., Advances in FeRAM Technologies, Celis Semiconductor Corporation, 3 pp.

Liu, S. et al., a New Concept for Non-Volatile Memory: The Electric-Pulse Induced Resistive Change Effect in Colossal Magnetoresistive Thin Films, Non-Volatile Memory Conference, San Diego, CA, Nov. 6-7, 2001, 32 pp.

Liu, S.Q. et al., A New Concept for Non-Volatile Memory: The Electric-Pulse Induced Resistive Change Effect in Colossal Magnetoresistive Thin Films, Space Vacuum Epitaxy Center, 7 pp.

Dippert, B., Hitting their stride: Nonvolatile-memory upstarts draw near to established leaders, designfeature: Advanced nonvolatile memories, Jan. 20, 2005, EDN 55, 6 pp.

Lupo, D.W., Thin Film Electronics ASA, ThinFilm Presentation, May 9, 2007, Thin Film Electronics, 33 pp.

Derbenwick, G.F. et al., Advances in FeRAM Technology, Non Volatile Memory Technology Symposium, Nov. 15-16, 2000, Arlington, VA, 23 pp.

Lenssen, J.-M.H. et al., Expectations of MRAM in comparison with other non-volatile memory technologies, 6 pp.

Maimon, J. et al., Chalcogenide-Based Non-Volatile Memory Technology, Mission Research Corporation, 18 p.

Deak, J.G., Spin Injection in Thermally Assisted Magnetic Random Access Memory, NVE Corporation, 15 pp.

Anderson, J.M. et al., Address line-assisted switching of vertical magnetoresistive random access memory (VMRAM) cells, 49th Conference on Magnetism and Magnetic Materials, 15 pp.

Daughton, J., Magnetic Spin Devices: 7 Years from Lab to Product, Symposium X, MRS 2004 Fall Meeting, Dec. 1, 2004, 27 pp.

Tondra, M. et al., High Temperature Pinning Properties of IrMn vs. FeMn in Spin Valves, J. Vacuum Science and Technology, Jul./Aug. 1999, 15 pp.

Deak, J., Thermal Magnetic Random Access Memory, IEEE International Conference on Computer Design, New Memory Technologies, Oct. 4, 2005, 38 pp.

Deak, J. et al., Effect of Resistance-Area-Product and Thermal Environment on Writing of Magneto-Thermal MRAM, Mar. 13, 2006, 3 pp.

Daughton, J., Spintronic Applications at NVE, Cornell University, May 14, 2004, 39 pp.

Wang, D. et al., Spin dependent tunneling junctions with reduced Neel coupling, J. Appl. Phys., vol. 93, No. 10, Parts 2 & 3, May 15, 2003, pp. 8558-8560.

Sinclair, A. et al., Scaling and Power Properties of Thermally Written MRAM, Abstract, NVE Corporation, 1 p.

Carson, J.C. et al., High Density Packaging of Non-Volatile Memory, Irvine Sensors Corporation, 3 pp.

Diao, Z. et al., Spin-transfer torque switching in magnetic tunnel junctions and spin-transfer torque random access memory, J. Phys. Condens. Matter 19 (2007) 165209, 13 pp.

Manchon, A. et al., Modelling spin transfer torque and magnetoresistance in magnetic multilayers, J. Phys. Condens. Matter 19 (2007) 165212, 42 pp.

Tiusan, C. et al., Spin tunnelling phenomena in single-crystal magnetic tunnel junction systems, J. Phys. Condens. Matter 19 (2007) 165201, 35 pp.

Ochiai, T. et al., Distinctive current-induced magnetization switching in a current-perpendicular-to-plane-giant magnetoresistance nanopillar with a synthetic antiferromagnet free layer, Appl. Phys. Lett 86, 242506 (2005), 3 pp.

Berger, L., Multilayer configuration for experiments of spin precession induced by a dc current, J. Appl. Phys., vol. 93, No. 10, Parts 2 & 3, May 15, 2003, pp. 7693-7695.

Jiang, Y. et al., Substantial reduction of critical current for magnetization switching in an exchange-biased spin valve, Nature Materials, vol. 3, Jun. 2004, pp. 361-364.

Slonczewski, J.C., Conductance and exchange coupling of two ferromagnets separated by a tunneling barrier, Phys. Rev. B, vol. 39, No. 10, Apr. 1, 1989, pp. 6995-7002.

Slonczewski, J.C., Currents, torques, and polarization factors in magnetic tunnel junctions, Phys. Rev. B 71, 024411 (2005), 10 pp.

Mao, S. et al., Commercial TMR Heads for Hard Disk Drives: Characterization and Extendibility At 300 Gbit/in2, IEEE Transactions on Magnetics, vol. 42, No. 2, Feb. 2006, pp. 97-102.

Coyne, J., Storage Market: Opportunities, Myths and Facts, Western Digital, May 17, 2007, 24 pp.

Shimazawa, K. et al., Enhanced GMR Ratio of Dual Spin Valve With Monolayer Pinned Structure, IEEE Transactions on Magnetics, vol. 42, No. 2, Feb. 2006, pp. 120-125.

Wurz, M.C. et al., Fabrication of a Micro Coil for Magnetooptical Data Storage, IEEE Transactions on Magnetics, vol. 42, No. 10, Oct. 2006, pp. 2468-2470.

Rottmayer, R.E. et al., Heat-Assisted Magnetic Recording, IEEE Transactions on Magnetics, vol. 42, No. 10, Oct. 2006, pp. 2417-2421.

Covington, M., Spin transfer and other challenges in data storage, Seagate Research, Pittsburgh, PA, 27 pp.

Kumar, S.B. et al., MR Enhancement in a Current Perpendicular-to-Plane Spin Valve by Insertion of a Ferromagnetic Layer Within the Space Layer, IEEE Transactions on Magnetics, vol. 42, No. 10, Oct. 2006, pp. 2459-2461.

Wong, P-K. et al., Reliability of Tunneling Magnetoresistance Recording Head—Lifetime, Failure Mode, and Production Screening, IEEE Transactions on Magnetics, vol. 42, No. 2, Feb. 2006, pp. 232-236.

White, R.M. et al., Spin Transfer Stimulated Noise in Magnetic Recording Heads, Data Storage Systems Center, 41 pp.

Park, C. et al., Annealing effects on structural and transport properties of rf-sputtered CoFeB/MgO/CoFeB magnetic tunnel junctions, J. Appl. Phys. 99, 08A901 (2006), 3 pp.

Wiese, N. et al., Antiferromagnetically coupled CoFeB/Ru/CoFeB trilayers, arXiv:cond-mat/0509749v1, Sep. 28, 2005, 3 pp.

Peng, Y. et al., Characterization of interfacial reactions in magnetite tunnel junctions with transmission electron microscopy, J. Appl. Phys., vol. 95, No. 11, pp. Jun. 1, 2004, 6798-6800.

Svedberg, E.B., Diffusion in Co90Fe10/Ru multilayers, J. Appl. Phys., vol. 94, No. 2, Jul. 15, 2003, pp. 993-1000.

Roy, A.G. et al., Effect of seed layers in improving the crystallographic texture of CoCrPt perpendicular recording media, J. Appl. Phys., vol. 91, No. 10, May 15, 2002, pp. 8076-8078.

Perdue, K.L. et al., Exchange Bias and Giant Magnetoresistance in Spin Valves with Angstrom-Scale Antiferromagnetic Layers at 5 K, Harvey Mudd College, Apr. 29, 2005, 40 pp.

Svedberg, E.B. et al., Interdiffusion in CoFe/Cu multilayers and its application to spin-valve structures for data storage, J. Appl. Phys., vol. 94, No. 2, Jul. 15, 2003, pp. 1001-1006.

Park, C. et al., Interfacial Composition and Microstructure of Fe3O4 Magnetic Tunnel Junctions, IEEE Transactions on Magnetics, vol. 39, No. 5, Sep. 2003, pp. 2806-2808.

Kim, Y.K. et al., Investigation of Magnetoresistive Characteristics of Metallic Multilayers Comprising Ru-Based Synthetic Antiferromagnetic Layers, J. Korean Phys. Soc., vol. 43, No. 3, Sep. 2003, pp. 396-399.

Moyerman, S. et al., Magnetic structure variations during giant magnetoresistance training in spin valves with picoscale antiferromagnetic layers, J. Appl. Phys. 99, 08R505 (2006), 3 pp.

Lu, B. et al., The Physics of Ultrahigh-Density Magnetic Recording (Springer Series in Surface Sciences, 41), Chapter 2, Microstructure of Longitudinal Media, 38 pp.

Li, H.F. et al., Nanocrystallisation of an Fe44.5Co44.4Zr7B4 amorphous magnetic alloy, Philosophical Magazine, vol. 86, No. 10, Apr. 1, 2006, pp. 1355-1372.

Jeong, S. et al., Nanostructure and magnetic properties of polycrystalline FePdPt/MgO thin films, J. Appl. Phys., vol. 91, No. 10. May 15, 2002, pp. 8813-8815.

Hsu, Y.-N. et al, New Ni5Al3 Underlayer for Longitudinal Magnetic Recording Media, IEEE Transactions on Magnetics, vol. 38, No. 4, Jul. 2002, pp. 1803-1806.

Wierman, K.W. et al., RuxCr1-x/Ta underlayer for Co-alloy perpendicular magnetic recording, J. Appl. Phys., vol. 91, No. 10, May 15 2002, pp. 8031-8033.

Lee, J.C. et al., Stability enhancement of nanopillar structure for spin transfer magnetization switching using IrMn buffer layer, J. Appl. Phys. 99, 08G517 (2006), 3 pp.

Hsiao, A. et al., The Thermal, Magnetic, and Structural Characterization of the Crystallization Kinetics of Fe88Z47B4Cu1, An Amorphous Soft Magnetic Ribbon, IEEE Transactions on Magnetics, vol. 38, No. 5, Sep. 2002, pp. 3039-3044.

Stohr, J. et al., Magnetization Manipulation in Nanostructures by Spin Currents, NSF, Div. of Condensed Matter Physics & U.S. Dept. of Energy, 14 pp.

Kong, J.H. et al, Magnetization Reversal of Co/Cu/Co Pillars by Spin-Polarized Current with Magnetic Fields, J. Korean Phys. Soc., vol. 46, No. 4, Apr. 2005, pp. 931-936.

Berger, L., Emission of spin waves by a magnetic multilayer traversed by a current, Phys. Rev. B, vol. 54, No. 13, Oct. 1, 1996, pp. 9353-9358.

Slonczewski, J.C., Current-driven excitation of magnetic multilayers, Journal of Magnetism and Magnetic Materials 159 (1996), pp. L1-L7.

Berger, L., Multilayer configuration for experiments of spin precession induced by a dc current, J. Appl. Phys., vol. 93, No. 10, May 15, 2003, pp. 7693-7695.

Huai, Y. et al., Observation of spin-transfer switching in deep submicron-sized and low-resistance magnetic tunnel junctions, Appl. Phys. Lett., vol. 84, No. 16, Apr. 19, 2004, pp. 3118-3120.

Fuchs, G.D. et al., Adjustable spin torque n magnetic tunnel junctions with two fixed layers, Appl. Phys. Lett. 86, 152509 (2005), 3 pp.

Xu, Y. et al., In Situ ordering of FePt thin films with face-centered-tetragonal (001) texture on Cr100-xRux underlayer at low substrate temperature, App. Phys. Lett., vol. 80, No. 18, May 6, 2002, pp. 3325-3327.

Grollier, J. et al., Spin-polarized current induced switching in Co/Cu/Co pillars, App. Phys. Lett., vol. 78, No. 23, Jun. 4, 2001, pp. 3663-3665.

Sun, C.J. et al., Epitaxial L1o FePt magnetic thin films sputtered on Cu (001), App. Phys. Lett., vol. 82, No. 12, Mar. 24, 2003, pp. 1902-1904.

Yagami, K. et al., Low-current spin-transfer switching and its thermal durability in a low-saturation-magnetization nanomagnet, App. Phys. Lett., vol. 85, No. 23, Dec. 6, 2004, pp. 5634-5636.

Wang, J-P. et al., Composite media (dynamic tilted media) for magnetic recording, App. Phys. Lett. 86 (2005), 3 pp.

Seki, T. et al., Spin-polarized current-induced magnetization reversal in perpendicularly magnetized L1o-FePt layers, App. Phys. Lett. 88 (2006), 3 pp.

Gu, J. et al., Distributed Active Decoupling Capacitors for On-Chip Supply Noise Cancellation in Digital VLSI Circuits, IEEE 2660 Symp. on VLSI Circuits Digest of Tech. Papers, 2 pp.

Durlam, M. et al., A 1-Mbit MRAM Based on 1T1MTJ Bit Cell Integrated With Copper Interconnects, IEEE J. of Solid-State Circuits, vol. 38, No. 5, May 2003, pp. 769-773.

Kim, C.H. et al., PVT-Aware Leakage Reduction for On-Die Caches With Improved Read Stability, IEEE J. of Solid-State Circuits, vol. 41, No. 1, Jan. 2006, pp. 170-178.

Kim, T-H et al., A 0.2 V, 480 kb Subthreshold SRAM With 1 k Cells Per Bitline for Ultra-Low-Voltage Computing, IEEE J. of Solid-State Circuits, vol. 43, No. 2, Feb. 2008, pp. 518-529.

Kim, T-H et al., Silicon Odometer: An On-Chip Reliability Monitor for Measuring Frequency Degradation of Digital Circuits, IEEE J. of Solid-State Circuits, vol. 43, No. 4, Apr. 2008, pp. 874-880.

Tehrani, S. et al., Progress and Outlook for MRAM Technology, IEEE Transactions on Magnetics, vol. 35, No. 5, Sep. 1999, pp. 2814-2819.

Victora, R.H. et al., Composite Media for Perpendicular Magnetic Recording, IEEE Transactions on Magnetics, vol. 41, No. 2, Feb. 2005, pp. 537-542.

Kim, T-H et al., A High-Density Subthreshold SRAM with Data-Independent Bitline Leakage and Virtual Ground Replica Scheme, 2007 IEEE International Solid-State Circuits Conference, 3 pp.

Kil, J. et al., A High-Speed Variation-Tolerant Interconnect Technique for Sub-Threshold Circuits Using Capacitive Boosting, ISLPED '06, Oct. 4-6, 2006, pp. 67-72.

Keane, J. et al., An On-Chip NBTI Sensor for Measuring PMOS Threshold Voltage Degradation, ISLPED '07, Aug. 27-29, 2007, pp. 189-194.

Kim, C.H. et al., PVT-Aware Leakage Reduction for On-Die Caches with Improved Read Stability, 2005 IEEE International Solid-State Circuits Conference, 3 pp.

Sousa, R.C. et al., Tunneling hot spots and heating in magnetic tunnel junctions, J. Appl. Phys., vol. 95, No. 11, Jun. 1, 2004, pp. 6783-6785.

Shen, W.K. et al., In situ epitaxial growth of ordered FePt (001) films with ultra small and uniform grain size using a RuAl underlayer, J. Appl. Phys. 97 (2005), 3 pp.

Zhu, J-G, Pinholes and spin transfer effect in magnetic tunnel junction heads, J. Appl. Phys. 97 (2005), 3 pp.

Parkin, S.S.P. et al., Giant tunnelling magnetoresistance at room temperature with MgO (100) tunnel barriers, Nature Materials, vol. 3, Dec. 2004, pp. 862-867.

Yuasa, S. et al., Giant room-temperature magnetoresistance in single-crystal Fe/MgO/Fe magnetic tunnel junctions, Nature Materials, vol. 3, Dec. 2004, pp. 868-871.

Kaka, S. et al., Mutual phase-locking of microwave spin torque nano-oscillators, Nature Letters, vol. 437, Sep. 15, 2005, pp. 389-392.

Mancoff, F.B. et al., Phase-locking in double-point-contact spin-transfer devices, Nature Letters, vol. 437, Sep. 15, 2005, pp. 393-395.

Tsoi, M. et al., Excitation of a Magnetic Multilayer by an Electric Current, PRL, vol. 80, No. 19, May 11, 1998, pp. 4281-4284.

Jiang, Y. et al., Effective Reduction of Critical Current for Current-Induced Magnetization Switching by a Ru Layer Insertion in an Exchange-Biased Spin Valve, PRL, vol. 92, No. 16, Apr. 23, 2004, 4 pp.

Rippard, W.H. et al., Injection Locking and Phase Control of Spin Transfer Nano-oscillators, PRL 95, Aug. 5, 2005, 4 pp.

Gu, J. et al., A Switched Decoupling Capacitor Circuit for On-Chip Supply Resonance Damping, 2007 Symp. on VLSI Circuits Digest of Technical Papers, pp. 126-127.

Kim, T-H et al., Silicon Odometer: An On-Chip Reliability Monitor for Measuring Frequency Degradation of Digital Circuits, 2007 Symp. on VLSI Circuits Digest of Technical Papers, pp. 122-123.

Kim, C.H. et al., A Process Variation Compensating Technique for Sub-90nm Dynamic Circuits, 2003 Symp. on VLSI Circuits Digest of Technical Papers, pp. 205-207.

Kim, C.H. et al., An On-Die CMOS Leakage Current Sensor for Measuring Process Variation in Sub-90nm Generations, 2005 IEEE International Conference on Integrated Circuit and Technology, 2 pp.

* cited by examiner

LOW RESISTANCE HIGH-TMR MAGNETIC TUNNEL JUNCTION AND PROCESS FOR FABRICATION THEREOF

CROSS REFERENCE TO RELATED APPLICATION

This application is a continuation-in-part of U.S. application Ser. No. 11/674,124 filed on Feb. 12, 2007, entitled "Non-Uniform Switching Based Non-Volatile Magnetic Based Memory," which claims priority to U.S. Provisional Application No. 60/853,115 filed on Oct. 20, 2006 entitled "Non-Uniform Switching Based Non-Volatile Magnetic Based Memory"; and is a further continuation-in-part of U.S. application Ser. No. 11/678,515 filed Feb. 23, 2007, entitled "A High Capacity Low Cost Multi-State Magnetic Memory," which claims priority to U.S. Provisional Application No. 60/777,012 filed Feb. 25, 2006 entitled "A High Capacity Low Cost Multi-State Magnetic Memory"; and is a further continuation-in-part of U.S. application Ser. No. 11/739,648, filed Apr. 24, 2007 entitled "Non-Volatile Magnetic Memory with Low Switching Current and High Thermal Stability"; and is a further continuation-in-part of U.S. application Ser. No. 11/740,861, filed Apr. 26, 2007, titled "High Capacity Low Cost Multi-Stacked Cross-Line Magnetic Memory"; and is a further continuation-in-part of U.S. application Ser. No. 11/776,692, filed Jul. 12, 2007, titled "Non-Volatile Magnetic Memory Element with Graded Layer"; and is a further continuation-in-part of U.S. application Ser. No. 11/860,467 filed Sep. 24, 2007, titled "Low cost multi-state magnetic memory"; and is a further continuation-in-part of U.S. application Ser. No. 11/866,830 filed Oct. 3, 2007 entitled "Improved High Capacity Low Cost Multi-State Magnetic Memory"; and is a further continuation-in-part of U.S. application Ser. No. 11/932,940 filed Oct. 31, 2007 entitled "Current-Confined Effect of Magnetic Nano-Current-Channel (NCC) for Magnetic Random Access Memory (MRAM)," which claims priority to U.S. Provisional Application No. 60/863,812 filed Nov. 1, 2006 entitled "Novel Spintronic Device."

BACKGROUND OF THE INVENTION

1. Field of the Invention

The present invention relates to magnetic based sensors and particularly to low switching current non-volatile magnetic based memory.

2. Description of the Prior Art

Computers conventionally use various media for data storage. Prevalent media include rotating magnetic media, such as hard disk drives (HDDs) for non-volatile storage, or dynamic random access memory (DRAM) and static RAM (SRAM), which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost.

There has been an extensive effort in development of Magnetic RAM (MRAM) as an alternative to existing data storage technologies. One of the problems with prior art memory structures is that the current and power requirements are too high to make a functional memory device or cell. This also poses a key concern regarding the reliability of such devices due to likely dielectric breakdown of the tunneling barrier layer and thereby making it non-functional.

The challenge with other prior art techniques has been that the switching current is too high to allow the making of a functional device for memory applications due to the memory's high power consumption. The high switching current is due, at least partly, to the memory element's electrical resistance. Several current solutions suggest that the switching current can be reduced by having the memory element pinned by two anti-ferromagnetic (AF)-couple layers resulting in spin oscillations or "pumping" and thereby reducing the switching current. Although these methods are helpful in reducing the memory element's resistance, further improvements in reducing the resistance of magnetic memory devices is desirable.

One prior art technique disclosed a structure and process for reducing switching current by including a fixed layer, a barrier layer formed on top of the fixed layer, a first free layer formed on top of the barrier layer, a non-uniform switching layer (NSL) formed on top of the first free layer, and a second free layer formed on top of the non-uniform switching layer. In the foregoing, switching current was applied, in a direction substantially perpendicular to the fixed, barrier, first free, non-uniform and the second free layers causing switching between states of the first, second free and non-uniform layers with substantially reduced switching current. Although switching current is reduced, there is still a need for further reduction in switching current.

What is needed is magnetic memory with lower resistance, thus further reducing power consumption associated with reading and switching data bits.

SUMMARY OF THE INVENTION

To overcome the limitations in the prior art described above, and to overcome other limitations that will become apparent upon reading and understanding the present specification, the present invention discloses a structure and a corresponding method for fabrication of a magnetic storage memory device that is based on current-induced-magnetization-switching having reduced switching current in the magnetic memory.

Briefly, an embodiment of the present invention includes a current-switching magnetic memory element having a magnetic tunneling junction (MTJ), for storing one or more bits of information. The MTJ includes at least a fixed layer, a barrier layer, and a free layer. When one of several different levels of current is applied to the memory element, the applied current causes the free layer of the MTJ to switch to one of several different magnetic moments, or states.

Of the several layers in a memory element, the barrier layer typically has the highest electrical resistance. By reducing the resistivity of the barrier layer, the memory element's electrical resistivity, and the associated switching is accelerated especially in a memory array where voltage across the memory element depends on the size of the transistor, which advantageously increases scalability of such memory device having multiple memory elements. The reduction in resistance is achieved by placing the barrier layer under compressive stress. As is discussed below, this is accomplished by using a compressive stress inducing layer (CSIL) in the memory element, in one embodiment of the present invention. In another embodiment of the present invention this is achieved by using vacuum or inert gas sputtering and in yet another embodiment of the present invention, this is achieved by introduction of compressive stress-inducing molecules into the barrier layer's molecular lattice.

These and other objects and advantages of the present invention will no doubt become apparent to those skilled in the art after having read the following detailed description of the preferred embodiments illustrated in the several figures of the drawing.

IN THE DRAWINGS

Figure 2A:
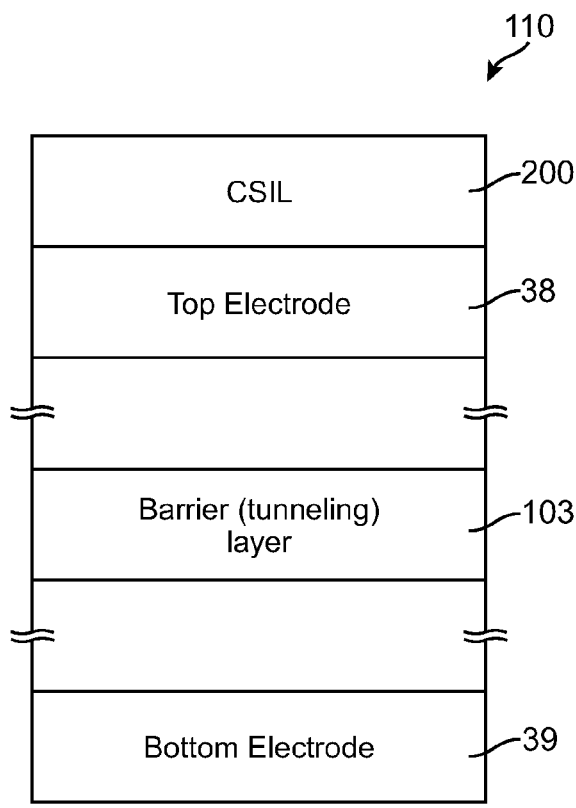
Figure 2B:
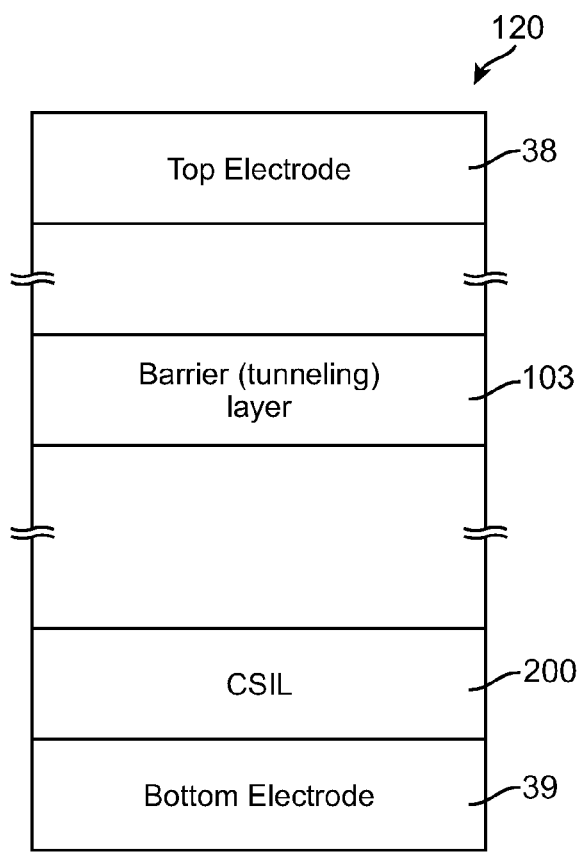

FIGS. 2(a) and 2(b) show examples of magnetic-tunneljunctions with barrier layer in conjunction with the CSIL layer.

Figure 3A:
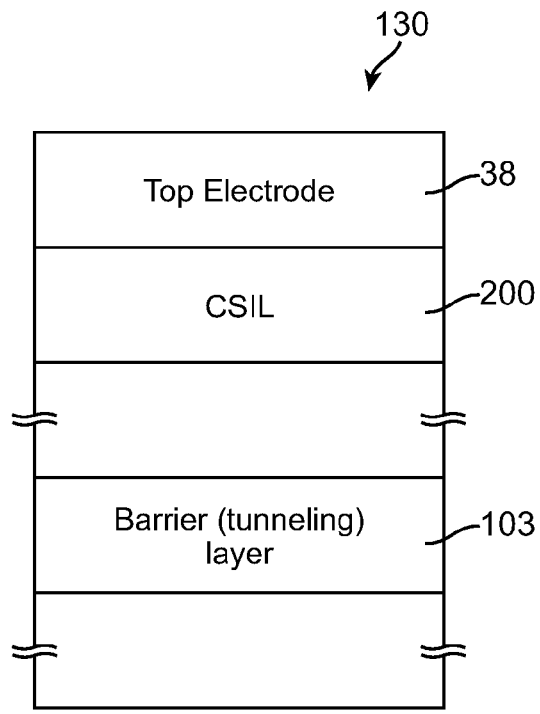

FIG. 3(a) shows an MTJ with a reduced resistance barrier layer under constant compressive stress caused by a layer of high-thermal expansion material deposited on top of the MTJ, and below the top electrode of the memory element, in accordance with an embodiment of the present invention.

Figure 3B:
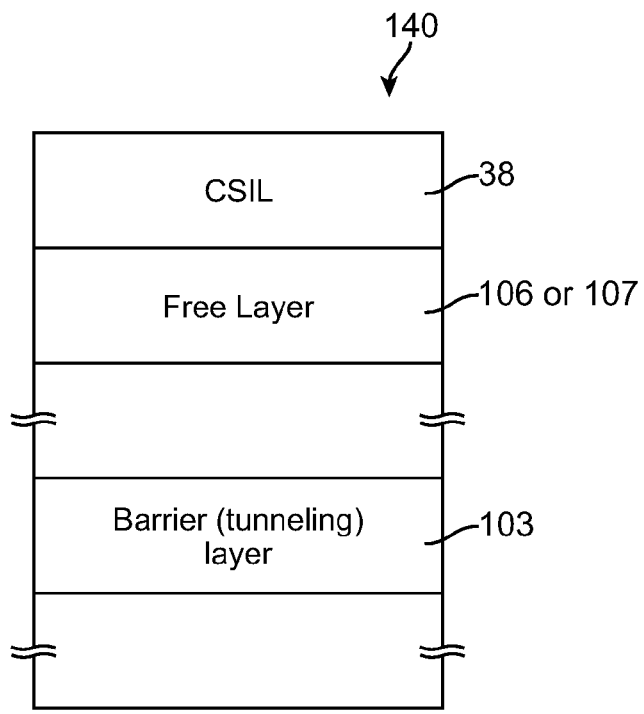

FIG. 3(b) shows an MTJ with a reduced resistance barrier layer under constant compressive stress caused by a layer of high-thermal expansion material deposited at the lower end of the MTJ, above the bottom electrode of the memory element, in accordance with another embodiment of the present invention.

Figure 4:
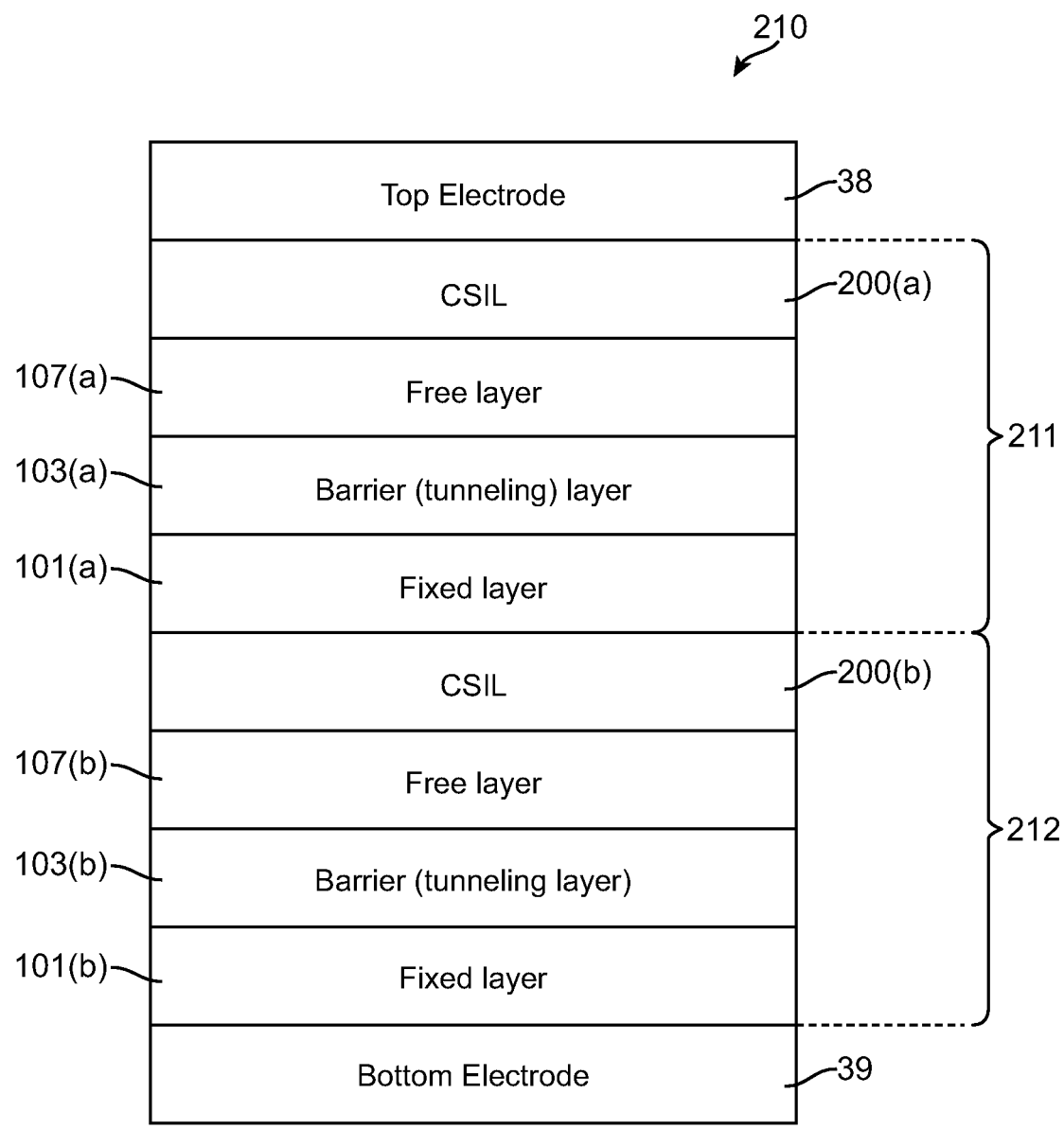

FIG. 4 shows an MTJ with a reduced resistance barrier layer under constant compressive stress caused by a layer of high-thermal expansion material deposited at the higher end of the MTJ, below the top electrode of the memory element as well as in between two MTJs for a multi-state memory design, in accordance with yet another embodiment of the present invention.

Figure 5:
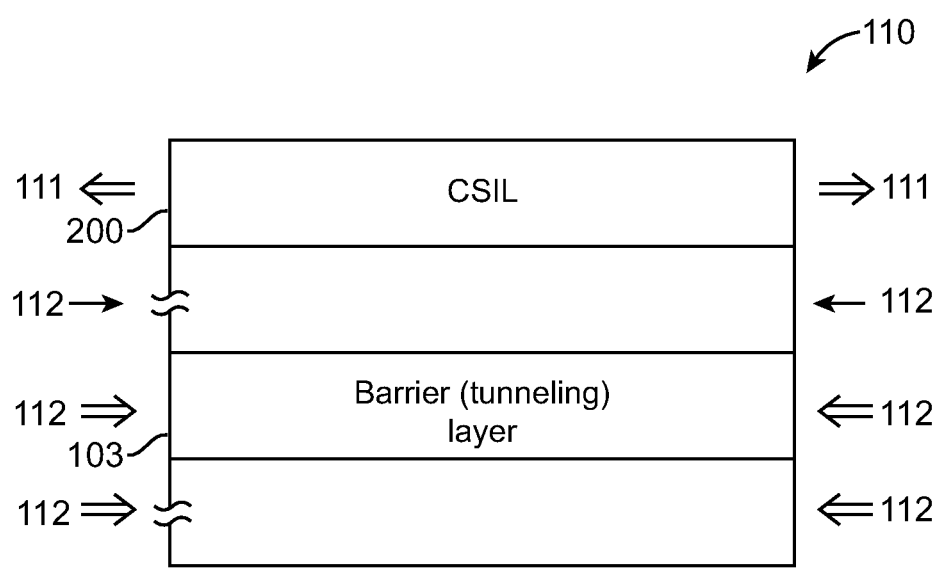

FIG. 5 shows the stress forces induced on the various layers in the MTJ after the deposition process is completed, and the layers have cooled to room temperature, according to an embodiment of the present invention.

Figure 6A:
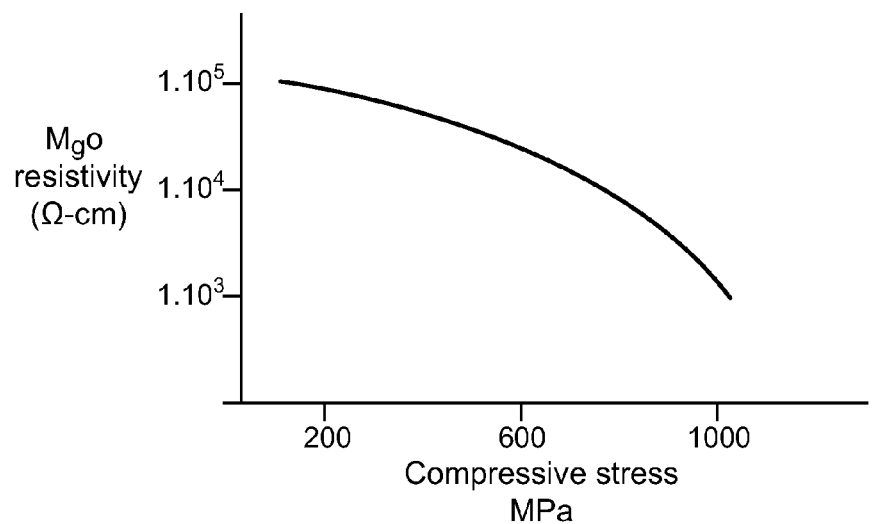

FIG. 6(a) shows the resistivity of the barrier layer, made of MgO, measured in $\Omega$/cm, as a function of compressive stress measured in MPascals.

Figure 6B:
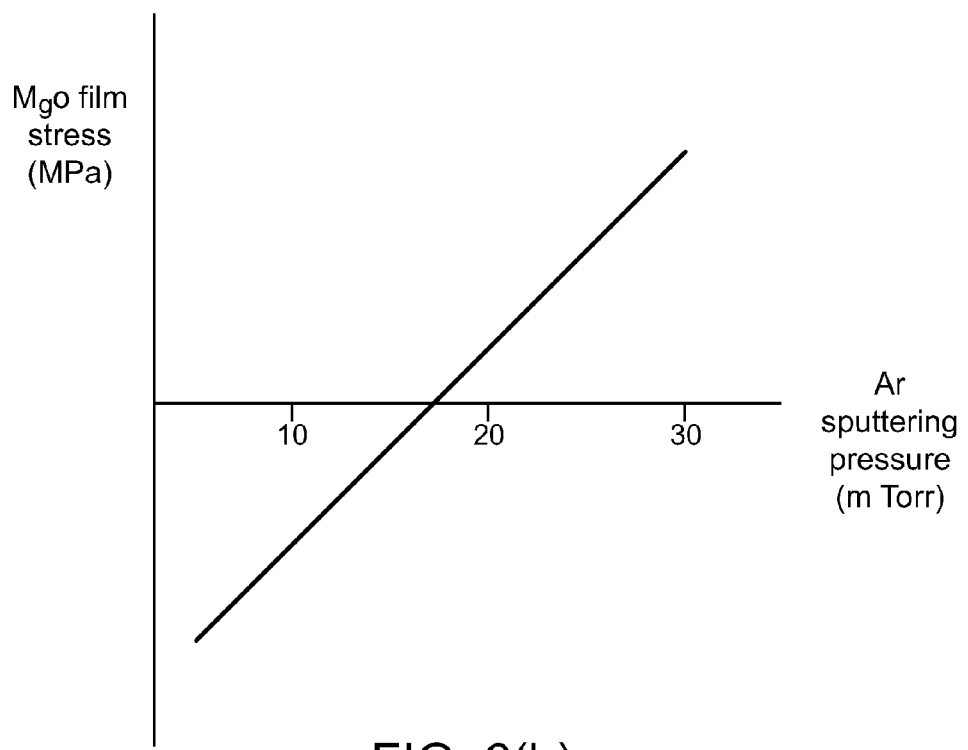

FIG. 6(b) shows the resistivity of an MgO barrier (tunneling) layer of the memory element, as a function of the argon pressure during sputtering.

Figure 7:
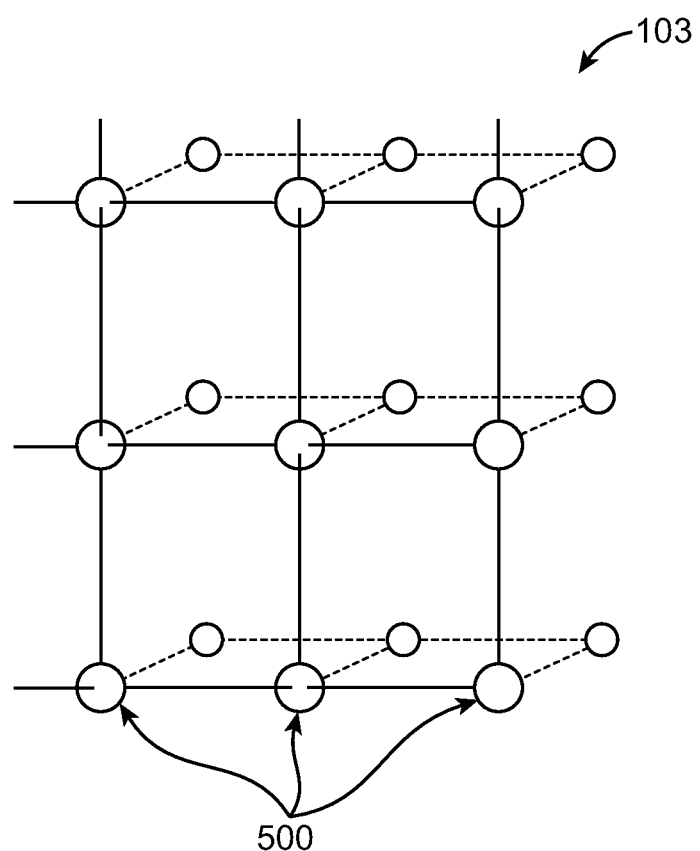

FIG. 7 shows a typical MgO barrier layer in a 3-dimensional lattice to comprise of MgO unit cells.

Figure 8:
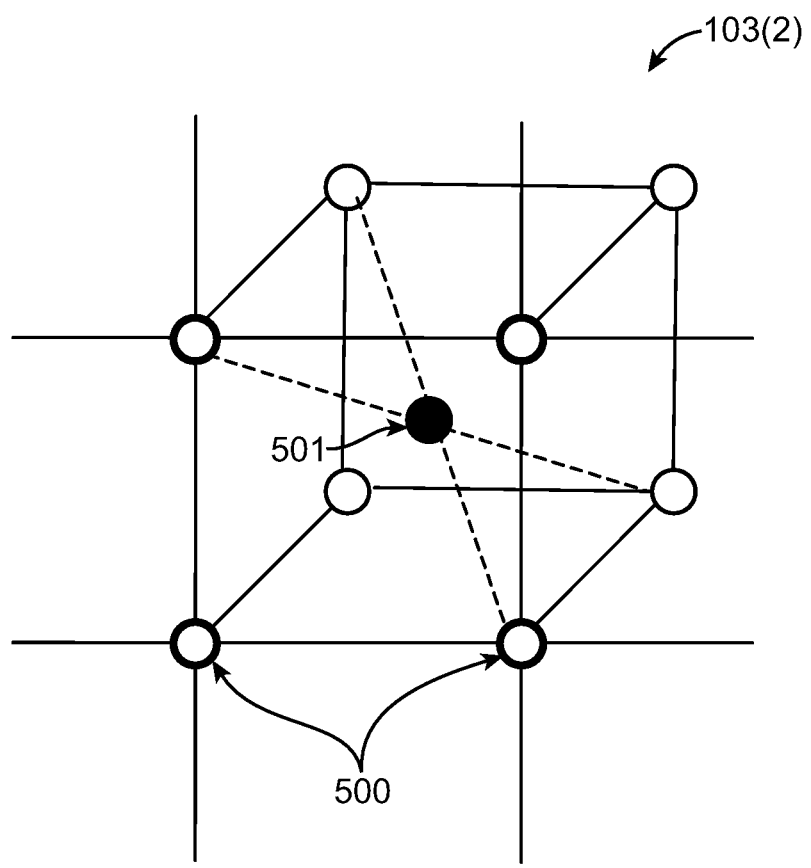

FIG. 8 shows the 3-dimensional lattice of a barrier layer with compressive stress inducing molecules introduced into the unit cells of the lattice structure according to an embodiment of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

The following are herein incorporated by reference as though set forth in full:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A high capacity low cost multi-state magnetic memory" by Ranjan et alia, U.S. application Ser. No. 11/739,648 Filed Apr. 24, 2007, titled "Non-volatile magnetic memory with low switching current and high thermal stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Apr. 26, 2007, titled "High capacity low cost multi-stacked cross-line magnetic memory" by Ranjan et alia, U.S. Application No. 60/863,812, filed Nov. 1, 2006, titled "Novel spintronic device" by Wang, U.S. application Ser. No. 11/932,940 filed Oct. 31, 2007 titled "current-confined effect of magnetic nano-current-channel (NCC) for magnetic random access memory (MRAM)" by Wang, U.S. application Ser. No. 11/866,830 filed Oct. 3, 2007, titled "Improved high capacity low cost multi-state magnetic memory" by Ranjan et alia, and U.S. application Ser. No. 11/860,467 filed Sep. 24, 2007, titled "Low cost multi-state magnetic memory" by Ranjan et alia.

Typically, a non-volatile magnetic memory element includes a free layer, a barrier layer, and a fixed layer among a plurality of layers. Together, these layers comprise a magnetic tunneling junction (MTJ). Each memory element is comprised of a single MTJ, or multiple MTJs "stacked" upon each other in order to increase memory storage density. The fixed layer's magnetic polarity is static, or "fixed," for example by an adjacent "pinning layer." The free layer's magnetic polarity can be switched between at least two states by passing an electrical current through the MTJ.

As electrons flow through the free layer, the magnetic moment of the free layer polarizes the "spin-states" of the electrons. The quantum tunneling effect, which is wellknown to those familiar with the art, causes a portion of the spins to tunnel through the barrier layer. The probability that any given spins will tunnel through the barrier layer is determined by the spin states of that electron and the magnetic moment of the fixed layer.

In non-relativistic quantum mechanics, the transmission coefficient is used to describe the behavior of waves incident on a barrier. The transmission coefficient represents the probability flux of the transmitted wave relative to that of the incident wave. It is often used to describe the probability of a particle tunneling through a barrier. The transmission coefficient is defined in terms of the incident and transmitted probability current density j according to:

$$T = \frac{|j_{transmitted}|}{|j_{incident}|}, \quad \text{Equation (1)}$$

where $j_{incident}$ is the probability current in the wave incident upon the barrier and $j_{transmitted}$ is the probability current in the wave moving away from the barrier on the other side.

As used herein, the electrical resistivity of the barrier layer is the inverse of its tunneling coefficient minus one:

$$R = \frac{1}{T} - 1 \quad \text{Equation (2)}$$

Therefore, for example, a barrier layer with a tunneling coefficient of zero is deemed to have infinite resistivity, whereas a barrier layer with a tunneling coefficient of 1 is deemed to have zero resistivity. It should be noted that Equation (2) is shown here to merely illustrate the relationship between a barrier layer's electrical resistivity with its tunneling coefficient. Equation (2) is not necessarily widely used in the art, nor is the value of resistivity necessarily measured in Ohms.

Thus, the barrier layer's resistivity is determined by the probability of spins tunneling through the barrier layer. Conversely, the probability of spins tunneling through the barrier layer is determined by the spin of the electrons. Since the spin of the electrons is determined by the magnetic moment of the free layer, changing the magnetic moment of the free layer affects the electrical resistivity of the barrier layer.

Abstractly, in the magnetic memory element, the state of the MTJ represents a binary value. At any given moment, the state of the MTJ is determined by its electrical resistance, which is a function of the current last applied to the memory element. Each MTJ is capable of having at least two unique resistance values. The resistance value is read to determine the state, in binary format, of the MTJ.

Effectively, the resistance of the MTJ is determined by the direction of the magnetic moments of the MTJs' free and fixed layers in respect to each other. The MTJ takes on one of several states at any given time, each having a unique electrical resistivity. In its simplest form, the MTJ has only two states, representing a binary 1 or 0. Other exemplary embodiments of the MTJ are disclosed in the applications incorporated by reference hereinabove, For example, U.S. Application No. 60/853,115, filed Oct. 20, 2006, titled "Non-Uniform Switching Based Non-Volatile Magnetic Base Memory" by Ranjan, discloses a non-uniform switching layer to reduce the current necessary to switch the magnetic moment of the free layer. Similarly, U.S. application Ser. No. 11/860,467 filed Sep. 24, 2007, titled "Low cost multi-state magnetic memory" by Ranjan et alia discloses MTJs that have several states. The several states represent more than one binary digit. For example, a 4-state MTJ can depict binary values 00, 01, 10, and 11.

Figure 1A:
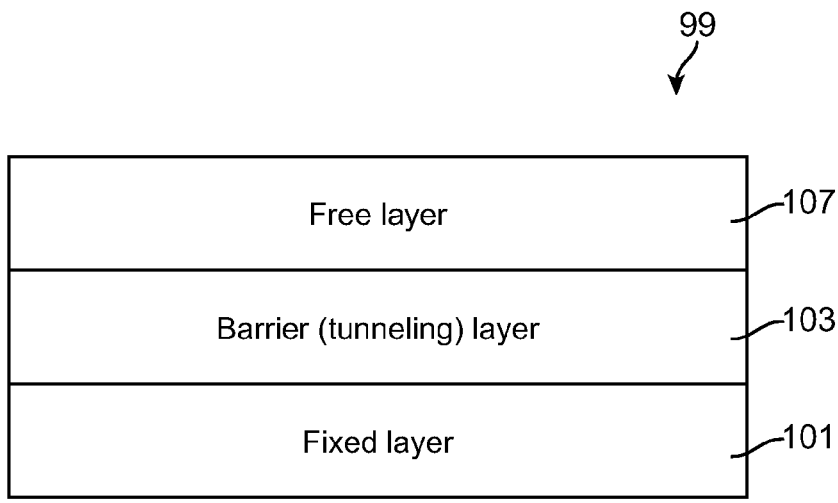
FIG. 1(a) shows relevant layers of a magnetic tunneling junction (MTJ) to include a fixed layer, a barrier (or tunneling) layer, and a free layer.

Referring now to FIG. 1(a), relevant layers of an MTJ 99 is shown to include a fixed layer 101, a barrier (or tunneling) layer 103, and a free layer 107. The barrier layer 103 is shown formed on top of the fixed layer 101 and the free layer 107 is shown formed on top of the barrier layer 103.

The fixed layer 101 is generally made of magnetic material and in an exemplary embodiment is typically made of CoFe alloys. In one embodiment, the fixed layer 101 comprises of three layers namely, Cobalt-iron-boron alloy, CoFeB, Ruthenium, Ru, and Cobalt-iron alloy, CoFe, with CoFeB alloy layer being largely amorphous and placed adjacent to the barrier layer. The barrier layer 103 is generally made of non-magnetic material, such as magnesium oxide (MgO), titanium oxide (TiO2), aluminum oxide (Al2O3), ruthenium oxide (RuO), strontium oxide (SrO), europium oxide (EuO) and any combination of these as well as other minority oxides. The free layer 107 is generally made of magnetic material and in an exemplary embodiment is made of Cobalt-iron-boron alloy, CoFeB or multi-layers of CoFe or NiFe or other relatively lower anisotropy alloys of Cobalt, Co, iron, Fe, and nickel, Ni.

Figure 1B:
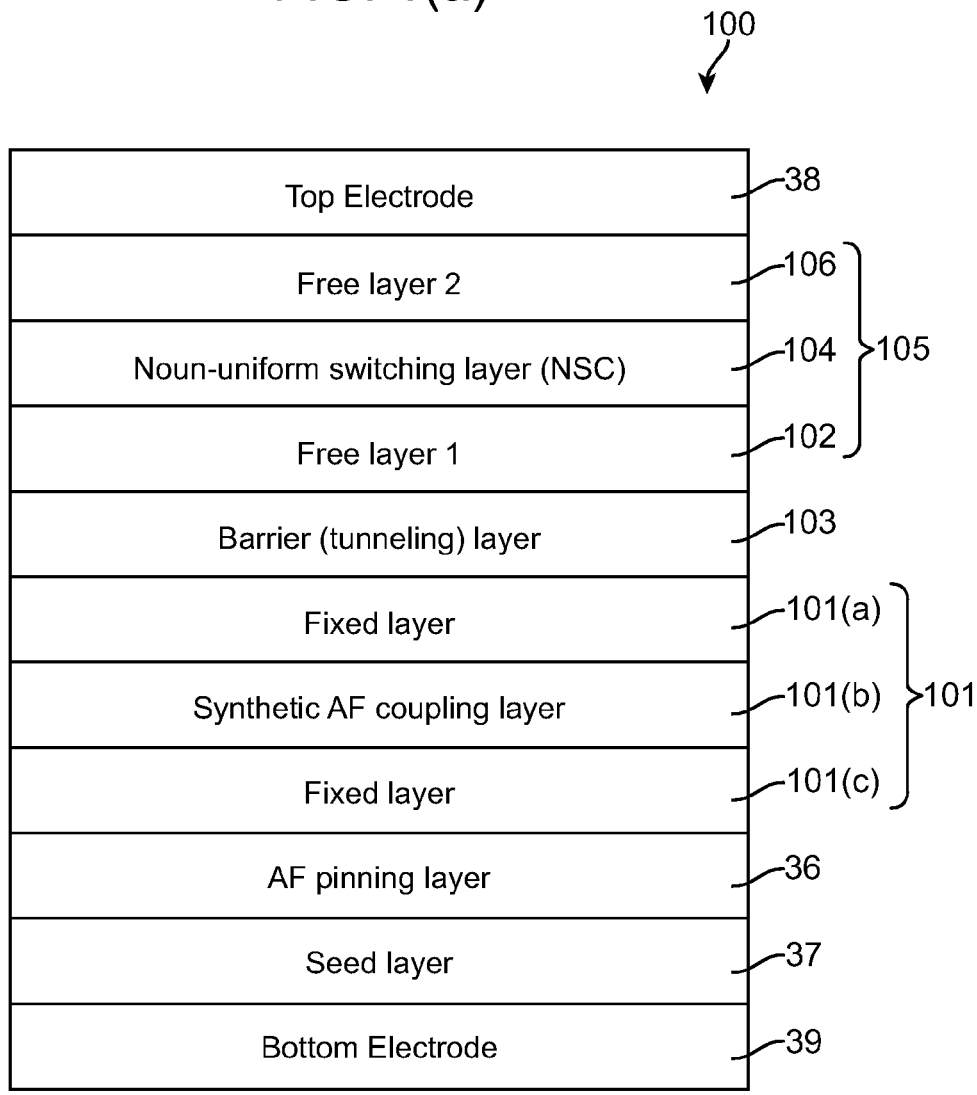
FIG. 1(b) shows relevant layers of an exemplary embodiment of a non-uniform switching based non-volatile magnetic memory element.

FIG. 1(b) shows relevant layers of one embodiment of a non-uniform switching based non-volatile magnetic memory element 100, in accordance with an embodiment of U.S. application Ser. No. 11/674,124, filed Feb. 12, 2007, titled "Non-Uniform Switching Based Non-Volatile Magnetic Based Memory" by Ranjan et alia, the contents of which are incorporated by reference hereinabove.

Referring now to FIG. 1(b), relevant layers of an exemplary embodiment of a non-uniform switching based non-volatile magnetic memory element 100 are shown. The memory element 100 is shown to generally include the layers included in the MTJ 99 in addition to other layers. More specifically, the memory element 100 is shown to include a bottom electrode 39, a seed layer 37 shown formed on top of the bottom electrode 39, an anti-ferromagnetic (AF) pinning layer 36, shown formed on top of the seed layer 37, a fixed layer 101 shown formed on top of the AF pinning layer 36, a barrier layer 103 shown formed on top of the fixed layer 101. Shown formed on the barrier layer 103 is a free layer 105, itself shown to be comprised of three layers, a free layer 1 102 shown formed on top of the barrier layer 103, a non-uniform switching-initiator layer (NSL) 104 shown formed on top of the free layer 1 102, and a free layer 2 106 shown formed on top of the NSL 104. Shown formed on top of the free layer 2 106 is a top electrode 38. In this embodiment of the non-uniform switching based non-volatile magnetic memory element 100, the fixed layer 101 is shown to be made of multiple layers.

The memory element 100, among other characteristics, exhibits low switching current when the magnetization switches from one polarity (or state) to another. For example, in one embodiment of the present invention, the memory element 100 has been known to switch with a program current, applied substantially perpendicular to the memory element, within the range of for example, 100 to 1200 μA (micro amps) for memory elements having dimensions of approximately 0.15 μm*0.2 μm.

In one embodiment of the memory element 100, the fixed layer 101 is multi-layered, the multiple layers of which, in an exemplary embodiment are the following layers: cobolt iron chromium, on top of which is formed Ruthenium X (RuX), where X is one or more of the following: Chromium Cr, Molybdenum (Mo) and Tantalum (Ta), on top of which is formed cobolt iron boron chromium x (CoFeBCrx), wherein, x is typically 0-15 atomic percent.

In one embodiment of the memory element 100, the barrier (or tunneling) layer 103, as may be referred thereto, is made of magnesium oxide (MgO) and may contain a thin layer of magnesium (Mg) to ensure minimal damage to the underlying CoFeB layer during the time MgO is deposited, and also to ensure more perfect crystalline growth of the MgO layer.

It is worthy to note that the tunneling layer 103 is crystalline but the underlying CoFeB layer may be mostly amorphous at the time of deposition, but may become crystalline after the annealing process. The amorphous structure of the free layer 101 results in a smoother interface for enhanced magnetic tunneling. The AF pinning layer 36 can be made of either platinum manganese (PtMn) or iron iridium manganese (IrMn), and requires magnetic annealing process to create a preferred anisotropy. BE refers to the bottom electrode 39 which is deposited prior to the fixed-layer 101. The free layer, made of layers 102-106, is deposited directly on top of the barrier layer 103.

When forming the memory element 100, the layers 102, 104 and 106 are deposited sequentially without breaking the vacuum such that there is direct magnetic coupling between the adjacent layers. The non-uniform switching layer 104 is introduced to initiate a non-uniform switching of the free layer during current-induced switching processes leading to a substantially lower switching current being 2 to 5 fold less than that which would have been needed in the absence of the layer 104.

In one embodiment of the present invention, a typical thickness of each of the layers 102 and 106 is less than 10 nanometers (nm). The ratio of thickness of the layer 102 to the layer 106 is typically less than 5. It should be understood that wherever numbers or values or ranges thereof are provided herein, they are to serve as examples only and other dimensions and sizes are contemplated.

The layers 102 and 106 are each typically chosen from alloys having one or more of ferromagnetic primary elements from, for example, the materials Co, Fe and Ni and may include additional non-magnetic elements such as boron (B), chromium (Cr), rhodium (Rh), molybdenum (Mo), silicon (Si), zirconium (Zr), or any other type of glass forming elements or alloy material. In one embodiment of the present invention, the layer 102 is made of cobolt iron boron chromium (CoFeBCrx), where x is in the range of 0-15 molecular % The non-uniform switching layer 104 is typically made of an alloy of Co, Fe, Ni having one or more of these elements and including typically less than 50 mol % of oxides, nitrides, sulfides or phosphides such as titanium dioxide (TiO2), aluminum dioxide (Al2O3), magnesium oxide (MgO), tantalum oxide (Ta2O5), hafnium oxide (HfO2), zirconium dioxide (ZrO2), or tantalum nitride (TaN), and other types of non-conductive material. The choice of these compounds is based on at least two criteria namely, high heat of formation so that it does not decompose during the plasma deposition process using rf- or dc-magnetron sputtering, with or without the presence of reactive gases such as oxygen or nitrogen and oxygen or nitrogen containing gases, and low-level of solubility to the base elements such as Co, Fe, Ni and alloys of these. While specific material and sizes are provided herein, they are to serve merely as examples with other suitable material and sizes being contemplated.

In one embodiment of the present invention, the bottom electrode 39 promotes electrical conductivity. The seed layer 37 acts as a template for growth of the AF pinning layer 36. The fixed layer 101(c) is crystalline, and locks into the AF pinning layer 36. The fixed layer 101(a) is largely amorphous. The fixed layers 101(c) and 101(a) generally have opposing magnetic moments, resulting in substantially zero net magnetic fields on the free-layers 102, 104 and 106.

It should be noted that FIGS. 1(a) and 1(b) depict only two embodiments of an MTJ. In other embodiments, not shown, other variations can be introduced. For example, the order of the layers in the MTJ can be reversed, or multiple MTJs can be stacked on top of each other.

FIG. 7 shows the molecular structure of the barrier (tunneling) layer 103, which is comprised of molecules 500 in a 3-dimensional lattice configuration. The natural tendency of MgO is to form into a lattice structure, absent a crystalline underlying structure. The lattice is often compromised of a plurality of generally cube-shaped "unit cells." In this context a "unit cell" is often defined as the minimum number of atoms that replicate in the structure.

The molecular lattice of the barrier layer 103 shown in FIG. 7 is not under compressive stress, and has higher electrical resistivity. The higher electrical resistivity is undesirable because it results in a higher reading and switching current. It should be noted that electrical resistivity can be reduced by using a thinner barrier layer 103. However, reducing electrical resistivity by using a thinner barrier layer 103 comes at the expense of performance, reliability and scalability. The electrical resistivity of the barrier layer 103 is reduced when it is placed under compressive stress. The reduction of the electrical resistivity of the barrier layer 103, when placed under compressive stress, is due to modification of the band structure of the MgO through changing of its atom spacing, thus affecting the tunneling coefficient. This phenomenon is well-known to those skilled in the art. Reducing the electrical resistivity of the barrier layer 103 advantageously results in reduced reading and switching current, and also enables getting higher performance and higher reliability products.

Referring now to FIG. 2(a) a current-switching non-volatile magnetic memory element 110 is shown to include a bottom electrode (BE) 39 on top of which is shown formed a plurality of intermediate layers (shown by two discontinued lines), on top of which is shown formed a barrier layer 103, on top of which is shown a plurality of intermediate layers (shown by two discontinued lines), on top of which is shown formed a top electrode (TE) 38, on top of which is shown formed a compressive stress inducing layer (CSIL) 200, in accordance with an embodiment of the present invention. It is noted that wherever discontinued (swigly) lines appear in the figures of this patent document, they indicate layers that are typically formed between two other layers. For example, in one embodiment of the present invention, the intermediate layers between the BE 39 and the barrier layer 103 are analogous to the layers shown formed between the BE 39 and the barrier layer 103 of the memory element 100 (of FIG. 1(b). In another embodiment of the present invention, the intermediate layers are analogous to the layers shown formed in memory element 210 below the barrier layer 103(b). It is understood that other embodiments are similarly analogous.

In one embodiment of the present invention, the intermediate layers between the barrier layer 103 and the TE 38 are analogous to the layers shown formed between the barrier layer 103 and the TE 38 of the memory element 100 (of FIG. 1(b), while in another embodiment of the present invention, the intermediate layer are analogous to the layers shown formed in memory element 210 on top of the barrier layer 103(a).

In an exemplary embodiment of the present invention, the CSIL 200 is made of aluminum (Al) or an alloy of aluminum (Al) having typically a substantial portion of Al. However, in other embodiments of the present invention, the CSIL 200 can be formed from any conducting material whose thermal expansion coefficient exceeds that of the barrier layer 103. As will be discussed shortly, in yet other embodiments of the present invention, the CSIL 200 can be formed from a conducting material whose thermal expansion coefficient is substantially similar to, or even less than the barrier layer 103.

During the deposition process conducted when manufacturing the memory element 110, the CSIL 200 is deposited at high temperatures. Such high temperatures should exceed 250 degrees Celsius, and in an exemplary embodiment, should range between 325 and 400 degrees Celsius. As the CSIL cools, it shrinks. The rate at which a layer shrinks in response to temperature variance is sometimes depicted by a, which is calculated as follows:

$$\alpha = \frac{\Delta l/l}{\Delta T} \quad \text{Equation (3)}$$

Where Δl/l represents the ratio of change of length, and ΔT represents change in temperature, as measured in degrees Kelvin. The unit for a is commonly $K^{-1}$.

In one embodiment of the present invention, the α of the CSIL 200 should be at least twice that of the barrier layer 103. In an exemplary embodiment, the CSIL 200 has an α greater than $15 \times 10^{-6}$. Table 1 below shows a list of some of the materials that can be used to form the CSIL 200, and their corresponding α:

TABLE 1

| Material | α |
|---|---|
| Al | $25 \times 10^{-6}$ |
| Cu | $17 \times 10^{-6}$ |
| Zn | $35 \times 10^{-6}$ |
| CuZn | $19 \times 10^{-6}$ |
| Ag | $18 \times 10^{-6}$ |

The α of the barrier layer 103 depends upon the material used. In an exemplary embodiment, where the barrier layer 103 is formed from MgO, it has an α that is typically less than 1e-06.

In one embodiment of the present invention, the CSIL 200 has an α at least twice that of the barrier (tunneling) layer 103. Therefore, upon cooling, the CSIL shrinks more than the other layers. This shrinking differential induces compressive stress upon the other layers.

In other embodiments of the present invention, the CSIL 200 has an α that is substantially similar to, or even less than the α of the barrier layer 103, however, the CSIL 200 induces compressive stress upon the barrier layer 103 because the CSIL 200 is deposited at a substantially higher temperature than the barrier layer 103. Examples of materials with an α that is substantially similar to, or even less than the α of the barrier layer 103 are tungsten, W, tantalum, Ta, titanium-tungsten alloy, TiW, ruthenium, Ru, nickel-aluminum, NiAl, ruthenium-aluminum, RuAl, nickel-niobium, NiNb.

Several applications of the memory element 110 include non-volatile magnetic memory, thin-film head for hard-disc-drive and other sensors, such as pressure-sensor, magnetic field-sensor, stress-sensor, biological-sensors, biometric-sensors. Other applications are contemplated.

Referring now to FIG. 2(b) a current switching non-volatile magnetic memory element 120 is shown to include generally the same layers as that of the embodiment of FIG. 2(a) except that in this embodiment, the CSIL 200 is shown deposited towards the bottom of the MTJ, and more specifically on top of the bottom electrode 39 and below the barrier layer 103. As with the embodiment of FIG. 2(a), the CSIL 200 is deposited at high temperatures. As it cools, the CSIL 200 shrinks, inducing compressive stress upon the other layers, and advantageously reducing electrical resistivity of the barrier layer 103, resulting in reduced reading and switching current, which is desirable.

Referring now to FIG. 3(a) a current switching non-volatile magnetic memory element 130 is shown according to another embodiment of the present invention. The memory element 130 is shown to include generally the same layers as that of the embodiments of FIGS. 3(a) and 3(b) except that in this embodiment, the CSIL 200 is shown formed directly below the top electrode 38 and generally on top of the barrier layer 103.

Referring now to FIG. 3(b) a current switching non-volatile magnetic memory element 140 is shown according to another embodiment of the present invention. The memory element 140 is shown to comprise generally the same layers as that of the embodiments of FIGS. 3(a) and 3(b) except that in this embodiment, the CSIL 200 replaces the top electrode 38. In the embodiment shown in FIG. 3(b), the CSIL 200 is formed directly on top of the free layer, which may be the free layer 106 or 107 of the previous embodiments.

Referring now to FIG. 4, a current switching non-volatile magnetic memory element 210 is shown to include a top MTJ 211 and a bottom MTJ 212 in accordance with another embodiment of the present invention. The top MTJ 211 and bottom MTJ 212 are shown to comprise generally the same layers as that of the embodiments of FIG. 1(a). Also shown is a CSIL 200(b) formed in the bottom MTJ 212, above the free layer 107(b) of the bottom MTJ 212 and below the fixed layer 101(a). Also shown is a CSIL 200(a) formed in the top MTJ 211 above the free layer 107(a) and below the top electrode 38.

The embodiment of FIG. 4 shows how, when multiple MTJs are stacked on top of each other, compressive stress can be induced upon the barrier layer 103 of all of the MTJs by using multiple CSILs 200, thereby advantageously reducing the electrical resistivity of the barrier layers 103, resulting in reduced reading and switching current, which is desirable.

All of these embodiments result in inducing compressive stress upon the barrier layer 103, through the use of an CSIL 200. In other embodiments, the entire MTJ stack can be deposited up-side-down, with the free layer 106 deposited on top of the bottom electrode 39, the non-uniform switching layer 104 deposited on top of the second free layer 106, and so forth. As with the other embodiments, where the MTJ stack is deposited up-side-down, compressive stress is induced on the barrier layer 103 by depositing a CSIL 200, at high temperature, either below the bottom electrode 39, or above it, or in place of it.

Referring now to FIG. 5, the stress forces induced on the various layers in the MTJ 110 is shown after the deposition process is completed, and the layers have cooled to room temperature, according to an embodiment of the present invention. The stress forces are shown to include decompressive stress forces 111 induced upon the CSIL 200, and compressive stress forces 112 induced upon the remaining layers of the MTJ 110.

At room temperature, the CSIL 200 seeks to shrink or compress to a smaller size. The remaining layers in the MTJR 110, however, stop this, and in the process induce tensile stress upon the CSIL 200, as shown by arrows 112. The tensile stress force 111 induced upon the CSIL 200 by the remaining layers, is equal and opposite to the compressive stress force 112 induced upon the remaining layers by the CSIL 200. These two forces cancel each other out, resulting in an MTJ that neither expands nor shrinks.

Referring now to FIG. 6(a) the resistivity of the barrier layer 103, made of MgO, measured in Ω-cm, is shown as a function of compressive stress measured in MPascals.

Since the barrier layer 103 has lower resistivity when it is under compressive stress, and since the barrier layer 103 has often the highest resistance of any of the layers in the MTJ, the induced compressive stress reduces the electrical resistance of the MTJ. This results in reduced switching and reading current.

In other embodiments, compressive stress is induced upon the barrier layer 103 in the deposition process itself, wherein an inert gas, typically Argon (Ar), is present during the sputtering process.

Referring now to FIG. 6(b) the film stress of a layer of MgO, measured in MPascals, is shown as a function of the Ar sputtering pressure, measured in mTorrs. As can be seen from this graph, in order to induce compressive stress on a deposited MgO film, in one embodiment of the present invention, the Ar sputtering pressure should be less than 15 mTorrs. It should be noted that while the exact number of the compressive stress of the film and the argon pressure depends on the details of the sputtering system, cathode design, target-to-substrate spacing, gas flow rates and pumping rates, etc., a preferred argon pressure is generally below 5 mtorr at a power density of below 0.5 w/cm2.

Referring now to FIG. 7, a typical MgO barrier layer 103 in a 3-dimensional lattice is shown to comprise of MgO unit cells 500. As shown in FIG. 7, the unit cell lattice structure is not under compressive stress, and therefore has high electrical resistivity.

Referring now to FIG. 8, the 3-dimensional lattice of a barrier layer 103(2) is shown with CSIMs 501 introduced into the unit cells of the lattice structure according to an embodiment of the present invention.

The CSIMs 501, typically being smaller than the other unit cells 500 in the barrier layer 103(b), induce compressive stress upon the entire barrier layer 103(b), thus reducing its electrical resistivity, Examples of materials that may be used for the CSIM include, but are not limited to Ruthenium oxide, $RuO_2$, strontitum oxide, SrO, strontium titanate, $SrTiO_3$, calcium oxide, CaO, titanium oxide, $TiO_2$, europium oxide, EuO. Of these, $RuO_2$, SrO and EuO are the more preferred as they pertain similar cubic structure as MgO. The typical percentages of these are below 50 mol % with a preferred range being below 10 mol %. The final film can be formed preferably by rf-sputtering form one composite target although these can be premixed in the plasma through multiple target sources or by using reactive sputtering such as in presence of a Ar—O2 or such oxidizing gases.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A current-switching non-volatile magnetic memory element including;
   a magnetic tunneling junction (MTJ) including a barrier layer, said barrier layer having associated therewith an electrical resistivity, and
   a compressive stress inducing layer (CSIL) formed on top of said MTJ and characterized to induce compressive stress on said MTJ thereby reducing electrical resistively of the barrier layer thereof.

2. The current-switching non-volatile magnetic memory element, as recited in claim 1, wherein said MTJ comprises:
   a fixed layer;
   said barrier layer formed on top of said fixed layer; and
   a free layer formed on top of said barrier layer.

3. The current-switching non-volatile magnetic memory element, as recited in claim 1, wherein said MTJ comprises:
   a free layer;
   said barrier layer formed on top of said free layer; and
   a fixed layer formed on top of said barrier layer.

4. The current-switching non-volatile magnetic memory element, as recited in claim 1, wherein said CSIL comprises one or more of the following materials: Al, Cu, Zn, CuZn, Ag., Ru, Ta, W, TiW, NiAL, RuAl, or NiNb.

5. The current-switching non-volatile magnetic memory element, as recited in claim 1, wherein said CSIL is deposited at a temperature in excess of 250° C.

6. A current-switching non-volatile magnetic memory element including;
   a compressive stress inducing layer (CSIL); and
   a magnetic tunneling junction (MTJ) formed on top of said CSIL,
   said MTJ including a barrier layer, said barrier layer having associated therewith an electrical resistivity,
   wherein said electrical resistivity of said barrier layer in said MTJ is reduced by compressive stress induced by said CSIL.

7. The current-switching non-volatile magnetic memory element, as recited in claim 6, wherein said MTJ comprises:
   a fixed layer, said barrier layer formed on said fixed layer; and
   a free layer formed on said barrier layer.

8. The current-switching non-volatile magnetic memory element, as recited in claim 6, wherein said MTJ comprises:
   a free layer, said barrier layer formed on top of said free layer; and
   a fixed layer formed on top of said barrier layer.

9. The current-switching non-volatile magnetic memory element, as recited in claim 6, wherein said CSIL comprises one or more of the materials: Al, Cu, Zn, CuZn, Ag., Ru, Ta, W, TiW, NiAL, RuAl, or NiNb.

10. The current-switching non-volatile magnetic memory element, as recited in claim 6, wherein said CSIL is deposited at a temperature in excess of 250° C.

11. A method of manufacturing current-switching non-volatile magnetic memory element comprising:
   forming a magnetic tunneling junction (MTJ) including a barrier layer, said barrier layer having associated therewith an electrical resistivity; and
   depositing at high temperature, a compressive stress inducing layer (CSIL) on top of said MTJ,
   wherein said CSIL, upon cooling, shrinks, thus inducing compressive stress on said barrier layer and resulting in reduction of electrical resistivity of said barrier layer.

12. The method of manufacturing current-switching non-volatile magnetic memory, as recited in claim 11, wherein said forming the MTJ step comprises:
   forming a fixed layer;
   depositing said barrier layer on top of said fixed layer; and
   depositing a free layer on top of said barrier layer.

13. The method of manufacturing current-switching non-volatile magnetic memory, as recited in claim 11, wherein said forming the MTJ step comprises:
   forming a free layer;
   depositing said barrier layer on top of said free layer; and
   depositing a fixed layer on top of said barrier layer.

14. The method of manufacturing current-switching non-volatile memory element, as recited in claim 11, wherein the CSIL is deposited at a temperature in excess of 250° C.

15. The method of manufacturing current-switching non-volatile memory element, as recited in claim 11, wherein said CSIL comprises one or more of the materials: Al, Cu, Zn, CuZn, Ag., Ru, Ta, W, TiW, NiAL, RuAl, or NiNb.

16. A method of manufacturing current-switching non-volatile magnetic memory element comprising:
   forming a magnetic tunneling junction (MTJ) including a barrier layer, said barrier layer having associated therewith an electrical resistivity,
   wherein electrical resistivity of said barrier layer is reduced by depositing said barrier layer under compressive film stress in a sputtering process with an inert gas.

17. The method of manufacturing current-switching-non-volatile memory element, as recited in claim 16, wherein said inert gas used in said sputtering process is comprised substantially of Ar, Kr, or Xe.

18. The method of manufacturing current-switching non-volatile memory element, as recited in claim 16, wherein said inert gas used during said sputtering process is at pressures less than 15 m Torrs.

19. The method of manufacturing current-switching-non-volatile memory element, as recited in claim 16, wherein said MTJ is formed by;
   forming a free layer;
   depositing said barrier layer on top of said free layer, and
   depositing a fixed layer on top of said barrier layer.

20. The method of manufacturing current-switching-non-volatile memory element, as recited in claim 16, wherein said MTJ is formed by the steps of:
   forming a fixed layer;
   depositing said barrier layer on top of said fixed layer; and
   depositing a free layer on top of said barrier layer.

21. The method of manufacturing current-switching non-volatile magnetic memory element comprising:
   forming a magnetic tunneling junction (MTJ) including a barrier layer, said barrier layer having associated therewith an electrical resistivity,
   wherein electrical resistivity of said barrier layer is reduced by dissolving into a molecular lattice of said barrier layer, compressive-stress-inducing molecules (CSIM).

22. The method of manufacturing current-switching-non-volatile memory element, as recited in claim 21, wherein said MTJ is formed by the steps of:
   forming a free layer;
   depositing said barrier layer on top of said free layer; and
   depositing a fixed layer on top of said barrier layer.

23. The method of manufacturing current-switching-non-volatile memory element, as recited in claim 21, wherein said MTJ is formed by the steps of:
   forming a fixed layer;
   depositing said barrier layer on said fixed layer; and
   depositing a free layer on said barrier layer.

24. The method of manufacturing current-switching non-volatile magnetic memory element, as recited in claim 21, wherein the barrier layer is formed substantially from MgO, and the CSIM that is dissolved into the barrier layer molecular lattice is comprised substantially of: RuO2, SrO, TiO2, SrTiO2, CaO, or EuO.

25. The method of manufacturing current-switching non-volatile magnetic memory element, as recited in claim 21, wherein the percent of CSIM dissolved into the molecular lattice of the barrier layer is below 10 mol %.

* * * * *